United States Patent
Muto et al.

(10) Patent No.: US 9,906,165 B2
(45) Date of Patent: Feb. 27, 2018

(54) SEMICONDUCTOR MODULE

(71) Applicant: Renesas Electronics Corporation, Tokyo (JP)

(72) Inventors: Kuniharu Muto, Tokyo (JP); Koji Bando, Tokyo (JP); Takamitsu Kanazawa, Tokyo (JP); Ryo Kanda, Tokyo (JP); Akihiro Tamura, Tokyo (JP); Hirobumi Minegishi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/194,624

(22) Filed: Jun. 28, 2016

(65) Prior Publication Data
US 2017/0033710 A1    Feb. 2, 2017

(30) Foreign Application Priority Data
Jul. 31, 2015    (JP) .................................. 2015-151555

(51) Int. Cl.
*H01L 23/495*    (2006.01)
*H01L 23/04*    (2006.01)
(Continued)

(52) U.S. Cl.
CPC ............ *H02M 7/537* (2013.01); *H01L 23/04* (2013.01); *H01L 23/49541* (2013.01);
(Continued)

(58) Field of Classification Search
CPC ..... H01L 2924/181; H01L 2924/00012; H01L 2224/73265; H01L 2224/32245; H01L 224/48247; H01L 2924/00; H01L 2224/0603; H01L 2224/4903; H01L 27/0664; H02M 7/537; H02M 7/003; H02M 7/53875
(Continued)

(56) References Cited

U.S. PATENT DOCUMENTS 6,291,880 B1 * 9/2001 Ogawa ................ H01L 23/4334
257/723
9,443,823 B2 * 9/2016 Hatakeyama ....... H01L 25/0657
(Continued)

FOREIGN PATENT DOCUMENTS

| JP | 11-233712 A | 8/1999 |
|---|---|---|
| JP | 2011-134990 A | 7/2011 |
| JP | 2015-065339 A | 4/2015 |

*Primary Examiner* — Alexander Oscar Williams
(74) *Attorney, Agent, or Firm* — Mattingly & Malur, PC

(57) ABSTRACT

Reliability of a semiconductor device is improved. A third semiconductor chip on which a control circuit is formed, and a first semiconductor chip of a plurality of IGBT chips are electrically connected via a high-side relay board. That is, the first semiconductor chip and the third semiconductor chip are electrically connected via a first wire, a high-side relay board and a second wire. Similarly, the third semiconductor chip on which the control circuit is formed and a second semiconductor chip of a plurality of IGBT chips are electrically connected via a low-side relay board. That is, the second semiconductor chip and the third semiconductor chip are electrically connected via the first wire, the low-side relay board and the second wire.

16 Claims, 21 Drawing Sheets

(51) Int. Cl.
*H01L 27/06* (2006.01)
*H02M 7/00* (2006.01)
*H02M 7/537* (2006.01)
*H02M 7/5387* (2007.01)

(52) U.S. Cl.
CPC ........ *H01L 27/0664* (2013.01); *H02M 7/003* (2013.01); *H02M 7/53875* (2013.01); *H01L 2224/0603* (2013.01); *H01L 2224/32245* (2013.01); *H01L 2224/48139* (2013.01); *H01L 2224/48247* (2013.01); *H01L 2224/4903* (2013.01); *H01L 2224/73265* (2013.01); *H01L 2224/92247* (2013.01); *H01L 2924/181* (2013.01)

(58) Field of Classification Search
USPC .................. 257/666–676, E23.031–E23.059, 257/E21.505, E23.039
See application file for complete search history.

(56) References Cited

U.S. PATENT DOCUMENTS

| | | | |
|---|---|---|---|
| 2010/0224906 A1* | 9/2010 | Kashiwagi | H01L 24/48 257/100 |
| 2011/0156229 A1 | 6/2011 | Shinohara | |
| 2015/0084173 A1 | 3/2015 | Zhang et al. | |
| 2015/0333038 A1* | 11/2015 | Hatakeyama | H01L 25/0657 257/777 |

* cited by examiner

SEMICONDUCTOR MODULE

CROSS-REFERENCE TO RELATED APPLICATION

The present application claims priority from Japanese Patent Application No. 2015-151555 filed on Jul. 31, 2015, the content of which is hereby incorporated by reference into this application.

TECHNICAL FIELD OF THE INVENTION

The present invention relates to a semiconductor device (semiconductor module). More particularly, the present invention relates to a semiconductor device in which a certain electronic component and other electronic component are electrically connected to each other via a member.

BACKGROUND OF THE INVENTION

Japanese Patent Application Laid-Open Publication No. 2011-134990 (Patent Document 1) describes a technique related to a semiconductor device which includes a microcomputer and a power MOSFET (Metal Oxide Semiconductor Field Effect Transistor). In this technique, a wiring board is mounted on a chip mounting portion, and a semiconductor chip which composes the microcomputer is stacked and arranged on the wiring board.

Japanese Patent Application Laid-Open Publication No. H11-233712 (Patent Document 2) describes a technique related to an inverter mounting composition. More specifically, Patent Document 2 describes a technique of mounting, on a chip mounting portion, an IGBT chip having an IGBT (Insulated Gate Bipolar Transistor) formed thereon or a diode chip having a diode formed thereon, and mounting, on the wiring board, a control chip having a control circuit which controls an IGBT switching operation formed thereon, or a chip component (a passive component such as a gate resistance).

Japanese Patent Application Laid-Open Publication No. 2015-65339 (Patent Document 3) describes a technique of controlling six IGBTs by using two control ICs. That is, the Patent Document describes a technique of controlling three high-side IGBTs by a high-side control IC, and controlling three low-side IGBTs by a low-side control IC.

SUMMARY OF THE INVENTION

For example, as a mounting composition of a semiconductor device which composes an inverter which controls a motor, compositions as described in the above-described Patent Documents 1 to 3 are cited. As a result of the study on this composition by the present inventors, it has been found by the present inventors that the compositions described in the above-described Patent Documents 1 to 3 have matters which need to be improved in consideration of reduction of a semiconductor device manufacturing cost and improvement of reliability of the semiconductor device.

Other object and novel characteristics will be apparent from the description of the present specification and the accompanying drawings.

In a semiconductor device according to one embodiment, a first electronic component and a part of a plurality of second electronic components are electrically connected to each other via a first wire which couples the first electronic component and a substrate, the substrate, and a second wire which couples the substrate and the part of the second electronic components.

According to one embodiment, reliability of a semiconductor device can be improved.

BRIEF DESCRIPTIONS OF THE DRAWINGS

DESCRIPTIONS OF THE PREFERRED EMBODIMENTS

Figure 1:
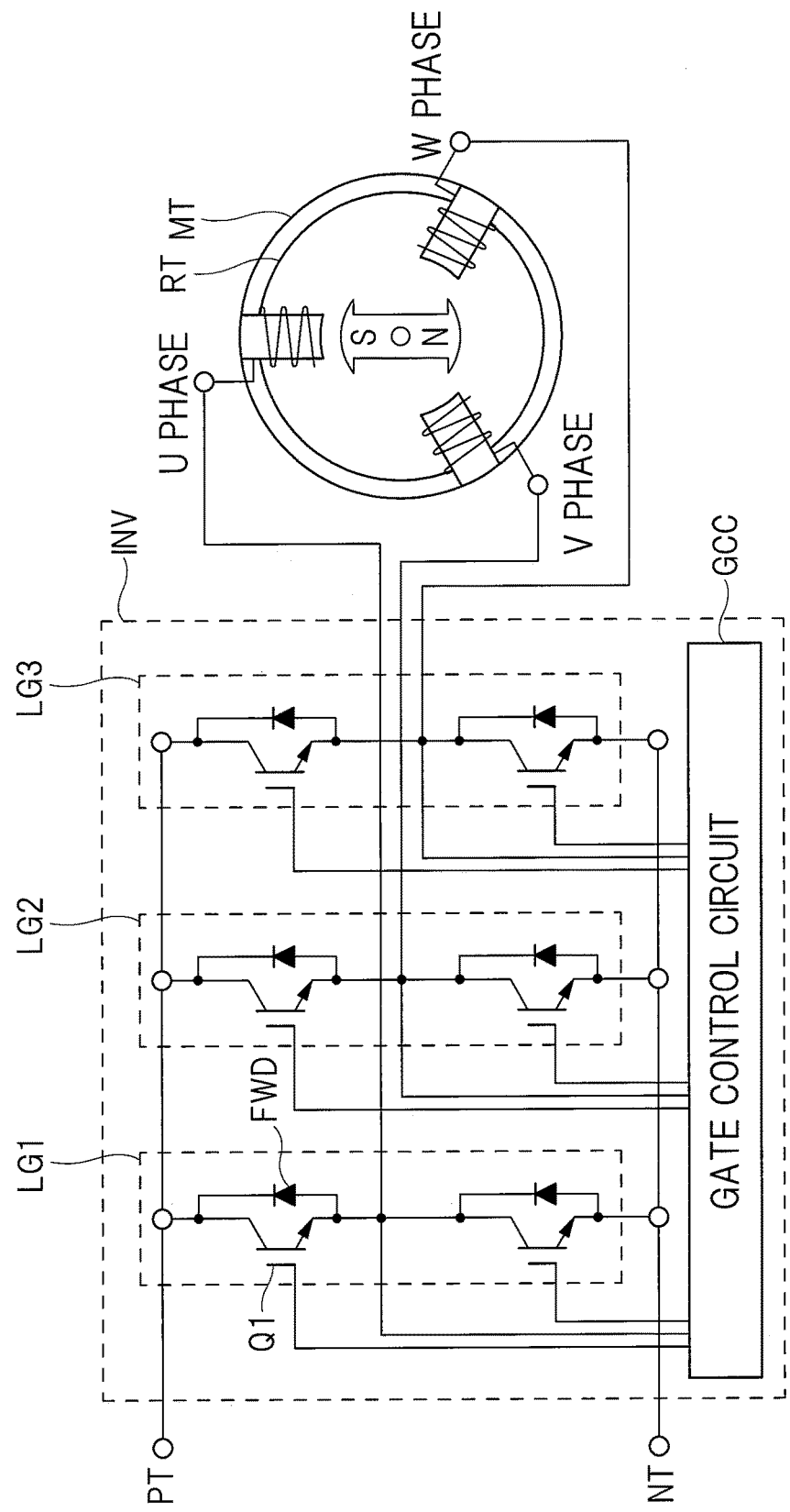
FIG. 1 is a circuit diagram illustrating a composition of an inverter circuit and a motor circuit including a three-phase induction motor according to the embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference symbols throughout all the drawings for describing the embodiments in principle, and the repetitive description thereof is omitted. Note that hatching is used even in a plan view so as to make the drawings easy to see.

EXPLANATION OF TERMS

In the present specification, an "electronic component" means a component which uses electrons. Particularly, a component which uses electrons in a semiconductor is a "semiconductor component". As an example of this "semiconductor component", a semiconductor chip can be cited. Therefore, a term including a "semiconductor chip" is a "semiconductor component", and a generic concept of the "semiconductor component" is the "electronic component".

Further, in the present specification, the "semiconductor device" is a structure which includes an external connection terminal electrically connected with this semiconductor component, and means a structure whose semiconductor component is covered with a sealing body. Particularly, the "semiconductor device" is composed so as to be capable of being electrically connected with an external device via the external connection terminal.

Further, in the present specification, a "power transistor" means an aggregate of unit transistors which achieves a function of each unit transistor by coupling a plurality of unit transistors (cell transistors) in parallel (by, for example, coupling several thousands or several tens of thousands of unit transistors in parallel) even in a larger current than an allowable current of each unit transistor. For example, when each unit transistor functions as a switching element, the "power transistor" is a switching element which is applicable to even a larger current than the allowable current of the unit transistor. Particularly, in the present specification, the term "power transistor" is used as, for example, a term representing the generic concept including both of the "power MOSFET" and the "IGBT".

<Composition Example of Three-Phase Inverter Circuit>

The semiconductor device according to the present embodiment is used for, for example, a drive circuit of a three-phase induction motor used for an air conditioner. More specifically, this drive circuit includes an inverter circuit, and this inverter circuit is a circuit having a function of converting direct-current power into alternating-current power.

FIG. 1 is a circuit diagram illustrating a composition of the inverter circuit and a motor circuit including the three-phase induction motor according to the present embodiment. In FIG. 1, the motor circuit includes a three-phase induction motor MT and an inverter circuit INV. The three-phase induction motor MT is composed to be driven by voltages of three different phases. More specifically, in the three-phase induction motor MT, a rotating magnetic field is generated around a rotor RT which is a conductor by using alternating currents of three phases referred to as a U phase, a V phase and a W phase whose phases are shifted by 120 degrees. In this case, the magnetic field rotates about the rotor RT. This means that a magnetic flux crossing the rotor RT which is the conductor changes. As a result, electromagnetic induction occurs in the rotor RT which is the conductor, and an induced current flows in the rotor RT. Further, a flow of an induced current in the rotating magnetic field means that a force is applied to the rotor RT by the Fleming's left-hand rule, and the rotor RT is rotated by this force. Thus, in the three-phase induction motor MT, the rotor RT can be rotated by using three-phase alternating currents. That is, the three-phase induction motor MT needs the three-phase alternating currents. Hence, in the motor circuit, alternating-current power is supplied to the induction motor by using the inverter circuit INV which generates an alternating current from a direct current. Further, in the present embodiment, one inverter circuit INV generates three types (the U phase, the V phase and the W phase) of alternating-current power, and supplies the alternating currents to the three-phase induction motor.

A composition example of this inverter circuit INV will be described below. As illustrated in FIG. 1, the inverter circuit INV according to the present embodiment is provided with, for example, IGBTs Q1 and diodes FWD corresponding to the three phases. That is, in the inverter circuit INV according to the present embodiment, a switching element which is a component of the inverter circuit INV is achieved by employing, for example, a composition in which each IGBT Q1 and each diode FWD as illustrated in FIG. 1 are coupled in anti-parallel coupling.

More specifically, an upper arm and a lower arm of a first leg LG1, an upper arm and a lower arm of a second leg LG2, and an upper arm and a lower arm of a third leg LG3 are formed by a component obtained by coupling the IGBTs Q1 and the diodes FWD in the anti-parallel coupling, respectively.

In other words, in the inverter circuit INV according to the present embodiment, the IGBT Q1 and the diode FWD are coupled in anti-parallel coupling between a positive potential terminal PT and each phase (the U phase, the V phase and the W phase) of the three-phase induction motor MT, and besides, the IGBT Q1 and the diode FWD are coupled in anti-parallel coupling between each phase of the three-phase induction motor MT and a negative potential terminal NT. That is, the two IGBTs Q1 and the two diodes FWD are provided for each phase. As a result, the inverter circuit INV according to the present embodiment includes six IGBTs Q1 and the six diodes FWD in total. Further, to a gate electrode of an individual IGBT Q1, a gate control circuit GCC is coupled, and a switching operation of the IGBT Q1 is controlled by this gate control circuit GCC. In the inverter circuit INV composed as described above, by controlling the switching operation of the IGBT Q1 by the gate control circuit GCC, direct-current power is converted into three-phase alternating-current power, and this three-phase alternating-current power is supplied to the three-phase induction motor MT.

<Necessity of Diodes>

As described above, the IGBTs Q1 are used as switching elements for the inverter circuit INV according to the present invention, and the diodes FWD are provided so as to be coupled with these IGBTs Q1 in anti-parallel coupling. Simply, the IGBT Q1 functioning as the switching element is necessary from a viewpoint of achieving the switching function by using the switching element. However, it is imagined that there is no necessary of provision of any diode FWD. In regard to this point, when a load coupled to the inverter circuit INV includes an inductance, there is necessary of provision of the diode FWD. A reason for the necessity will be described below.

When the load is a simple resistance which does not include an inductance, the diode FWD is unnecessary because of no energy reflux. However, there is a mode that, when a circuit including an inductance such as a motor is coupled to the load, this case has a mode in which a load current flows in a direction opposite to a direction of a switch which is turned on. That is, when the load includes the inductance, energy returns from the inductance of the load to the inverter circuit INV in some cases (a current flows backward).

At this time, the single IGBT Q1 itself does not have a function of causing this reflux current to flow, and therefore, it is necessary to couple the diode FWD with the IGBT Q1 in anti-parallel coupling. That is, when a load includes an inductance as motor control in the inverter circuit INV, energy ($\frac{1}{2} LI^2$) accumulated in the inductance certainly needs to be released at the turning off of the IGBT Q1. However, the IGBT Q1 itself cannot flow the reflux current for releasing the energy accumulated in the inductance. Hence, for causing the reflux of the electrical energy accumulated in this inductance, the diode FWD is coupled with the IGBT Q1 in anti-parallel coupling. That is, the diode FWD has a function of causing the reflux current to flow in order to release the electrical energy accumulated in the inductance. From the above description, it can be found that the inverter circuit coupled to the load including the inductance has the necessity of the provision of the diode FWD in anti-parallel coupling with the IGBT Q1 which is the switching element. The diode FWD is referred to as a freewheeling diode.

<Structure of IGBT>

Structures of the IGBT Q1 and the diode FWD which compose the inverter circuit INV according to the present embodiment will be described with reference to the drawings. The inverter circuit INV according to the present embodiment includes the IGBT Q1 and the diode FWD.

Figure 2:
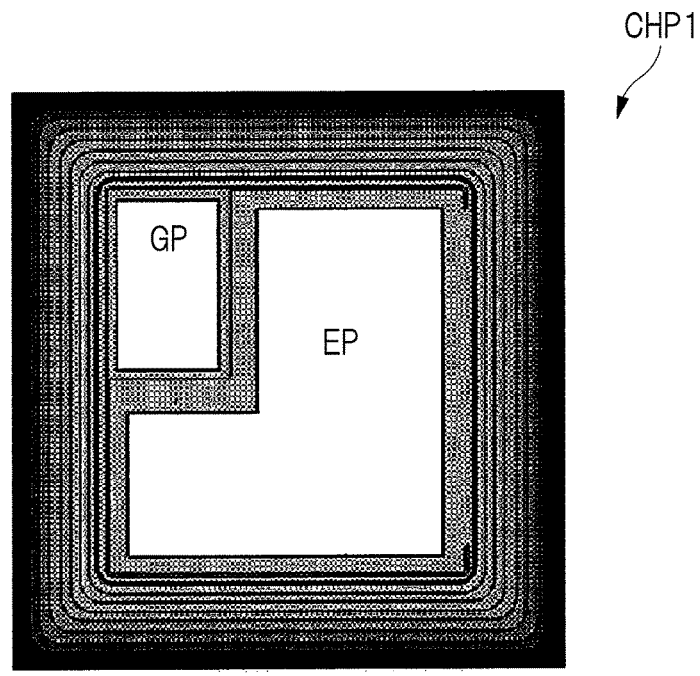
FIG. 2 is a plan view illustrating an appearance shape of a semiconductor chip on which an IGBT is formed.

FIG. 2 is a plan view illustrating an appearance shape of a semiconductor chip CHP1 on which the IGBT Q1 is formed. FIG. 2 illustrates a main surface (front surface) of the semiconductor chip CHP1. As illustrated in FIG. 2, a planar shape of the semiconductor chip CHP1 according to the present embodiment is, for example, square. Further, on the front surface of the semiconductor chip CHP1 having the square shape, an emitter electrode pad EP and a gate electrode pad GP are formed. Meanwhile, a collector electrode is formed on a back surface opposite to the front surface of the semiconductor chip CHP1 although not illustrated in FIG. 2.

<Structure of IGBT Device>

Figure 3:
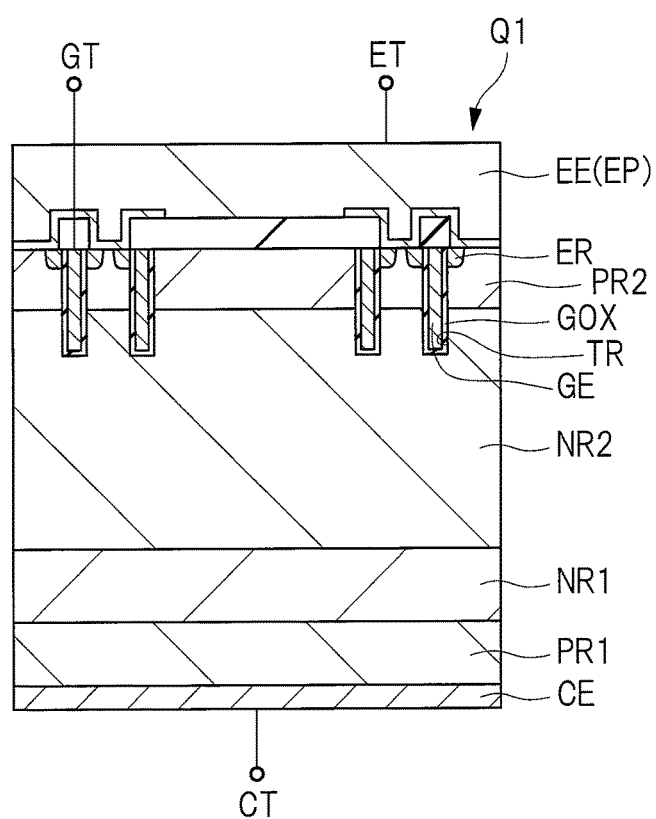
FIG. 3 is a cross-sectional view illustrating a device structure of the IGBT according to the embodiment.

Subsequently, a device structure of the IGBT Q1 will be described. FIG. 3 is a cross-sectional view illustrating the device structure of the IGBT Q1 according to the present embodiment. In FIG. 3, the IGBT Q1 includes a collector electrode CE formed on a back surface of a semiconductor chip, and a $p^+$-type semiconductor region PR1 is formed on this collector electrode CE. An $n^+$-type semiconductor region NR1 is formed on the $p^+$-type semiconductor region PR1, and an $n^-$-type semiconductor region NR2 is formed on this $n^+$-type semiconductor region NR1. Further, a p-type semiconductor region PR2 is formed on the $n^-$-type semiconductor region NR2, and a trench TR which penetrates this p-type semiconductor region PR2 and reaches the $n^-$-type semiconductor region NR2 is formed. Furthermore, an $n^+$-type semiconductor region ER which matches with the trench TR to be an emitter region is formed. Inside the trench TR, for example, a gate insulation film GOX formed of an oxide silicon film is formed, and a gate electrode GE is formed via this gate insulation film GOX. This gate electrode GE is formed of, for example, a polysilicon film, and is formed so as to fill the trench TR. Further, FIG. 3 illustrates a trench gate structure. However, the IGBT is not limited to this, and may be, for example, an IGBT using a planar gate structure formed on a silicon substrate although not illustrated.

In the IGBT Q1 composed as described above, the gate electrode GE is coupled with a gate terminal GT via the gate electrode pad GP illustrated in FIG. 2. Similarly, the $n^+$-type semiconductor region ER which is the emitter region is electrically connected with an emitter terminal ET via an emitter electrode EE (emitter electrode pad EP). The $p^+$-type semiconductor region PR1 which is the collector region is electrically connected with the collector electrode CE formed on the back surface of the semiconductor chip.

The IGBT Q1 composed as described above has both of high-speed switching characteristics and voltage drive characteristics of a power MOSFET, and low on-voltage characteristics of a bipolar transistor.

Note that the $n^+$-type semiconductor region NR1 is referred to as a buffer layer. This $n^+$-type semiconductor region NR1 is provided in order to prevent a punch-through phenomenon in which a depletion layer growing from the p-type semiconductor region PR2 to the $n^-$-type semiconductor region NR2 contacts the $p^+$-type semiconductor region PR1 formed in a lower layer of the $n^-$-type semiconductor region NR2 when the IGBT Q1 is turned off. Further, the $n^+$-type semiconductor region NR1 is provided in order to limit a hole injection amount from the $p^+$-type semiconductor region PR1 to the $n^-$-type semiconductor region NR2 or others.

<Operation of IGBT>

Next, an operation of the IGBT Q1 according to the present embodiment will be described. First, an operation of turning off the IGBT Q1 will be described. In FIG. 3, a MOSFET having a trench gate structure is turned on by sufficiently applying a positive voltage between the gate electrode GE and the $n^+$-type semiconductor region ER which is the emitter region. In this case, a forward bias is applied between the $p^+$-type semiconductor region PR1 and the $n^-$-type semiconductor region NR2 which composes a collector region, so that holes are injected from the $p^+$-type semiconductor region PR1 to the $n^-$-type semiconductor region NR2. Subsequently, electrons as much as the positive electrical charge of the injected holes are collected into the $n^-$-type semiconductor region NR2. Thus, a resistance of the $n^-$-type semiconductor region NR2 is decreased (conductivity is modulated), so that the IGBT Q1 is in an on-state.

A junction voltage of the $p^+$-type semiconductor region PR1 and the $n^-$-type semiconductor region NR2 is added to the on-voltage. However, in case of a high breakdown voltage which occupies most of the on-resistance, the IGBT Q1 has a lower on-voltage than that of the power MOSFET since a resistance value of the n⁻-type semiconductor region NR2 is decreased by one digit or more because of modulation of conductivity. Therefore, it is found that the IGBT Q1 is an effective device for increasing a breakdown voltage. That is, in a power MOSFET, it is necessary to increase a thickness of an epitaxial layer which is a drift layer to increase the breakdown voltage. However, in this case, the on-resistance also increases. On the other hand, in the IGBT Q1, even when the thickness of the n⁻-type semiconductor region NR2 is increased in order to increase the breakdown voltage, the modulation of conductivity occurs during the operation of turning on the IGBT Q1. Therefore, the on-resistance can be lower than that of the power MOSFET. That is, by the IGBT Q1, a device having a lower on-resistance than that of the power MOSFET can be achieved even in order to increase the breakdown voltage.

Subsequently, the operation of turning off the IGBT Q1 will be described. By decreasing a voltage between the gate electrode GE and the n⁺-type semiconductor region ER which is the emitter region, the MOSFET having the trench gate structure is turned off. In this case, hole injection from the p⁺-type semiconductor region PR1 to the n⁻-type semiconductor region NR2 stops, and lives of holes which have already been injected come to an end, and the number thereof decreases. The remaining holes directly flow out toward the emitter electrode EE side (as a tail current), and the IGBT Q1 becomes in an off-state at a moment at which the flowing out is completed. Thus, the IGBT Q1 can be turned on and off.

<Diode Structure>

Figure 4:
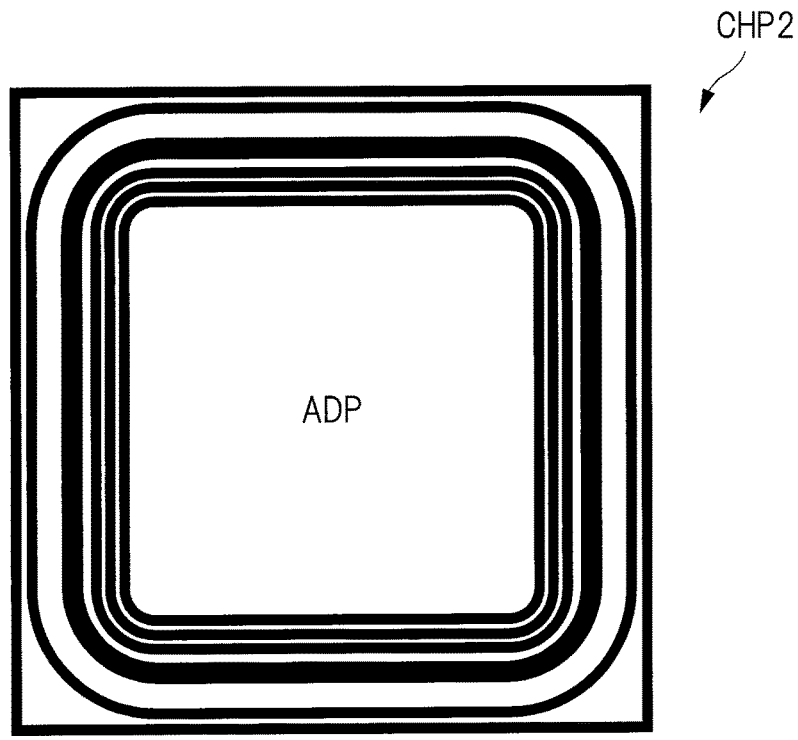
FIG. 4 is a plan view illustrating an appearance shape of the semiconductor chip on which a diode is formed.

Next, FIG. 4 is a plan view illustrating an appearance shape of a semiconductor chip CHP2 on which the diode FWD is formed. FIG. 4 illustrates a main surface (front surface) of the semiconductor chip CHP2. As illustrated in FIG. 4, a planar shape of the semiconductor chip CHP2 according to the present embodiment is, for example, square. Further, on the front surface of the semiconductor chip CHP2 having the square shape, an anode electrode pad ADP is formed. Meanwhile, although not illustrated, a cathode electrode pad is formed over an entire back surface opposite to the front surface of the semiconductor chip CHP2.

Figure 5:
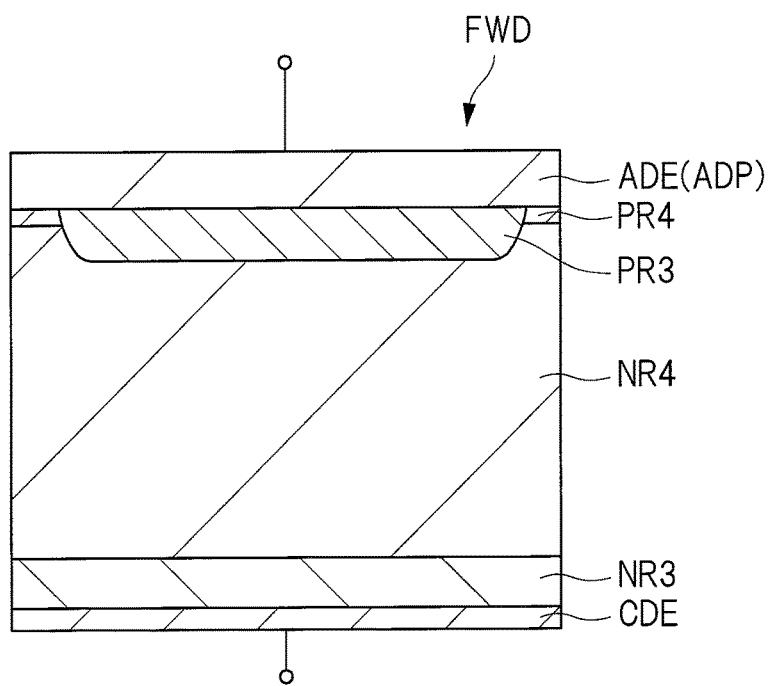
FIG. 5 is a cross-sectional view illustrating a device structure of the diode.

Subsequently, a device structure of the diode FWD will be described. FIG. 5 is a cross-sectional view illustrating the device structure of the diode FWD. In FIG. 5, a cathode electrode CDE is formed on a back surface of a semiconductor chip, and an n⁺-type semiconductor region NR3 is formed on this cathode electrode CDE. An n⁻-type semiconductor region NR4 is formed on the n⁺-type semiconductor region NR3, and a p-type semiconductor region PR3 is formed on this n⁻-type semiconductor region NR4. On the p-type semiconductor region PR3 and a p⁻-type semiconductor region PR4, an anode electrode ADE (anode electrode pad ADP) is formed. This anode electrode ADE is made of, for example, aluminum-silicon.

<Operation of Diode>

According to the diode FWD composed as described above, by applying a positive voltage to the anode electrode ADE and applying a negative voltage to the cathode electrode CDE, a p-n junction between the n⁻-type semiconductor region NR4 and the p-type semiconductor region PR3 becomes in a forward bias, so that a current flows. On the other hand, by applying a negative voltage to the anode electrode ADE, and applying a positive voltage to the cathode electrode CDE, a p-n junction between the n⁻-type semiconductor region NR4 and the p-type semiconductor region PR3 becomes in a reverse bias, so that the current does not flow. Thus, the diode FWD having a rectifying function can be operated.

<Composition of Gate Control Circuit>

Figure 6:
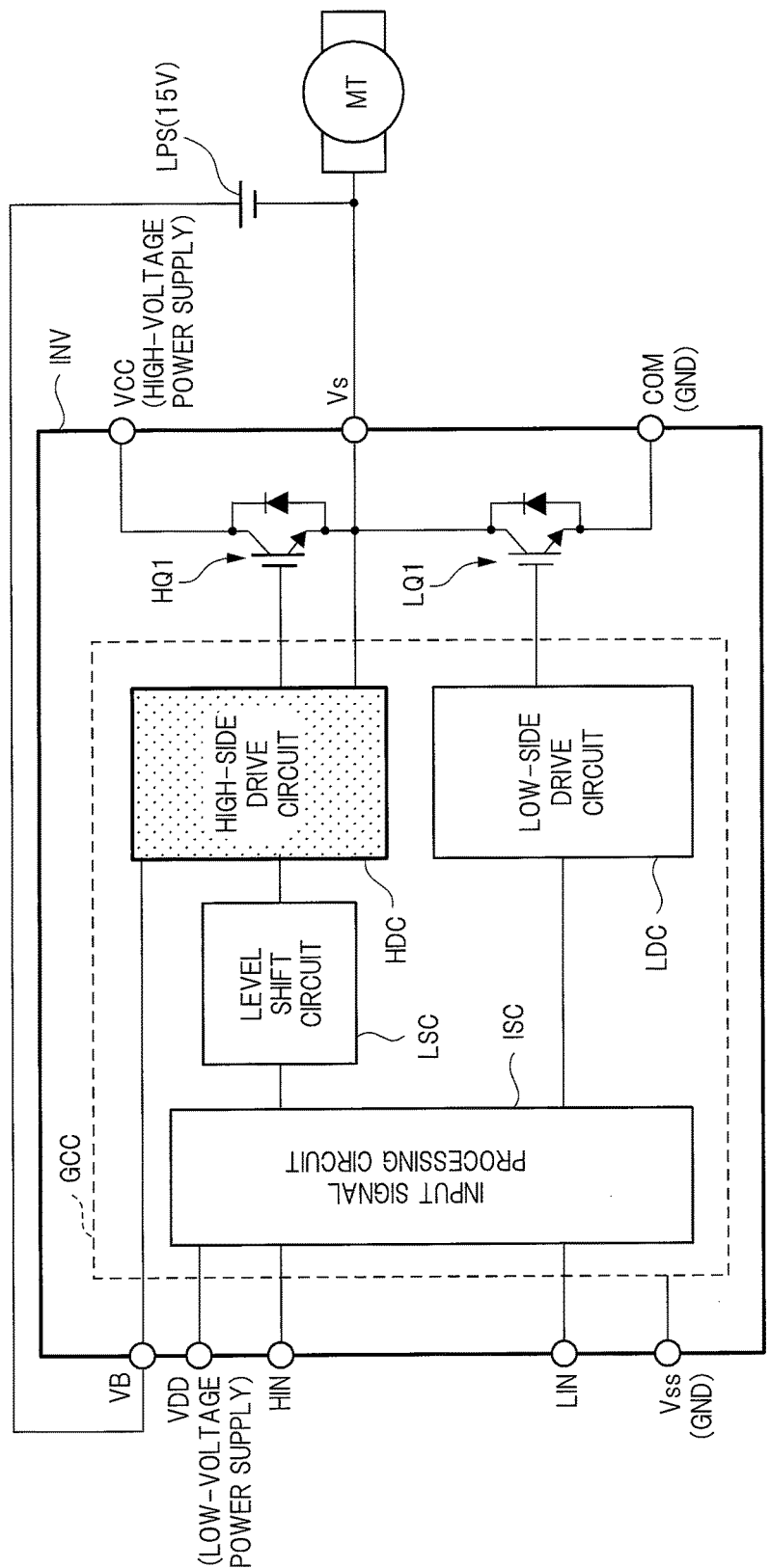
FIG. 6 is a view illustrating a circuit block composition of a gate control circuit.

Subsequently, FIG. 6 is a view illustrating a circuit block composition of the gate control circuit GCC. In FIG. 6, one of the three phases of the inverter circuit INV which drives the three-phase induction motor MT is cited as an example, the composition of the gate control circuit GCC which controls this one phase will be described. In FIG. 6, between a terminal VCC which is electrically connected with a high voltage power supply (600 V) and a terminal COM which is electrically connected with a ground, for example, a high-side IGBT (HQ1) and a low-side IGBT (LQ1) which compose the one phase of the inverter circuit INV are coupled in series. Further, an intermediate node between the high-side IGBT (HQ1) and the low-side IGBT (LQ1) is electrically connected with the three-phase induction motor MT via a terminal Vs.

Here, the gate control circuit GCC is composed to control an on/off operation of the high-side IGBT (HQ1) and an on/off operation of the low-side IGBT (LQ1). For example, the gate control circuit GCC achieves the on/off operation of the high-side IGBT (HQ1) by controlling a gate voltage applied to a gate electrode of the high-side IGBT (HQ1), and achieves the on/off operation of the low-side IGBT (LQ1) by controlling a gate voltage applied to a gate electrode of the low-side IGBT (LQ1).

More specifically, the gate control circuit GCC is coupled with a terminal VDD which is electrically connected with a low-voltage power supply, and a terminal Vss which is electrically connected with the ground. Further, the gate control circuit GCC includes an input signal processing circuit ISC which processes input signals inputted from a terminal HIN and a terminal LIN of the inverter circuit INV, a level shift circuit LSC, a low-side drive circuit LDC and a high-side drive circuit HDC.

Furthermore, the low-side drive circuit LDC controls a gate voltage applied to the gate electrode of the low-side IGBT (LQ1) based on a processing signal outputted from the input signal processing circuit ISC. For example, to the low-side drive circuit LDC, a GND potential (ground potential) is inputted from the terminal Vss, and a gate voltage generated based on this GND potential is supplied to the gate electrode of the low-side IGBT (LQ1). Here, while the low-side IGBT (LQ1) is turned on when the gate voltage to be supplied to the gate electrode is a threshold voltage or larger with respect to the GND potential, the low-side IGBT (LQ1) is turned off when the gate voltage to be supplied to the gate electrode is smaller than the threshold voltage with respect to the GND potential. Thus, the on/off operation of the low-side IGBT (LQ1) is controlled by the low-side drive circuit LDC.

Meanwhile, the high-side drive circuit HDC inputs a process signal of the input signal processing circuit ISC to the level shift circuit LSC, and then, controls a gate voltage applied to the gate electrode of the high-side IGBT (HQ1) based on an output signal from this level shift circuit LSC. For example, to the high-side drive circuit HDC, a reference potential which serves as a reference is inputted from the terminal Vs. That is, also in the high-side drive circuit HDC, it is necessary to generate a gate voltage applied to the gate electrode of the high-side IGBT (HQ1). However, when this gate voltage is generated, the reference potential is necessary. In regard to this point, for example, a GND potential inputted from the terminal Vss used in the low-side drive circuit LDC is considered to be used in the high-side drive circuit HDC. However, the high-side drive circuit HDC cannot use the GND potential inputted from the terminal Vss as the reference potential. That is, in the low-side IGBT (LQ1) in FIG. 6, the low-side IGBT (LQ1) can be turned on by applying a gate voltage, which is equal to or larger than a threshold, to an emitter potential of the low-side IGBT (LQ1). Hence, the gate voltage of the low-side IGBT (LQ1) is generated based on the emitter potential of the low-side IGBT (LQ1). At this time, the emitter potential of the low-side IGBT (LQ1) is the same potential as the GND potential, and therefore, the gate voltage of the low-side IGBT (LQ1) can be generated based on the GND potential inputted from the terminal Vss as the reference potential.

On the other hand, as illustrated in FIG. 6, also in the high-side IGBT (HQ1), the emitter potential of the high-side IGBT (HQ1) is used as the reference potential. However, the emitter potential of this high-side IGBT (HQ1) changes between the GND potential and a power supply potential. That is, when the low-side IGBT (LQ1) is turned on, the emitter potential of the high-side IGBT (HQ1) is the same potential as the GND potential. On the other hand, when the high-side IGBT (HQ1) is turned on, the emitter potential of the high-side IGBT (HQ1) is the same potential as the power supply potential. This means that it is necessary to generate a gate voltage based on the power supply potential in order to turn on the high-side IGBT (HQ1). Hence, a gate voltage applied to the gate electrode of the high-side IGBT (HQ1) cannot be generated based on the GND potential inputted from the terminal Vss.

In view of this, to the high-side drive circuit HDC, the emitter potential of the high-side IGBT (HQ1) is inputted from the terminal Vs, and a gate voltage applied to the gate electrode of the high-side IGBT (HQ1) is generated based on the potential inputted from this terminal Vs. Hence, the potential inputted from the terminal Vs changes up to the power supply potential, and therefore, a higher potential than the power supply potential is necessary for the gate voltage of the high-side IGBT (HQ1) generated based on the potential inputted from this terminal Vs. In view of this, in the high-side drive circuit HDC, for example, a terminal VB is coupled with a low voltage power supply LPS (15 V) positioned outside the inverter circuit INV (i.e., a semiconductor device SA1 illustrated in FIG. 11), so that a higher gate voltage than the power supply potential is generated by using the potential inputted from this terminal VB and the potential inputted from the above-described terminal Vs. This gate voltage is supplied from the high-side drive circuit HDC to the gate electrode of the high-side IGBT (HQ1). As described above, while the high-side IGBT (HQ1) is turned on when a gate voltage to be supplied to the gate electrode is equal to or larger than the threshold voltage based on the reference potential, the high-side IGBT (HQ1) is turned off when the gate voltage to be supplied to the gate electrode is smaller than the threshold voltage based on the reference potential. Thus, the on/off operation of the high-side IGBT (HQ1) is controlled by the high-side drive circuit HDC.

<Composition of Semiconductor Chip which Embodies Gate Control Circuit>

While the above-described gate control circuit GCC can be achieved by, for example, a semiconductor chip on which an integrated circuit is formed, the semiconductor chip which embodies the gate control circuit GCC has the following features. That is, the input signal processing circuit ISC, the level shift circuit LSC and the low-side drive circuit LDC which are the components of the gate control circuit GCC are designed based on the GND potential supplied from the terminal Vss, and therefore, can be made on a semiconductor substrate. On the other hand, the high-side drive circuit HDC is designed based on the potential which changes up to the power supply potential supplied from the terminal Vs, and therefore, needs to be formed separately from a semiconductor substrate (terminal Vss). More specifically, a floating structure having a high breakdown voltage is applied to the high-side drive circuit HDC, so that a "floating island structure" which is independent from the low-side drive circuit LDC is used. Further, this "floating island structure" has a limitation on signal exchange to/from the low-side drive circuit LDC, and can transmit and receive only a pulse signal via the level shift circuit LSC. In view of this, it is necessary to form a pad which is necessary for the high-side drive circuit HDC so as to have the "floating island structure". As described above, the semiconductor chip on which the gate control circuit GCC is formed has the feature of the "floating island structure".

<Study on Improvement>

For example, as a mounting composition of the semiconductor device which composes the inverter which controls the motor, the compositions as in the above-described Patent Documents 1 to 3 are cited. When the present inventors have studied on this composition, the present inventors have found that the compositions of the above-described Patent Documents 1 to 3 have matters to be improved in consideration of reduction of a manufacturing cost of the semiconductor device and improvement of reliability of the semiconductor device. Accordingly, hereinafter, the matters to be improved will be described first, and then, a technical idea of the present embodiment for which a device has been performed for the matters to be improved will be described.

For example, a composition example of the semiconductor device which embodies the inverter which controls the motor includes the compositions illustrated in FIG. 5 of Patent Document 1 and FIG. 4 of Patent Document 2. That is, an IGBT chip on which an IGBT (switching element) serving as the component of the inverter is formed and a diode chip on which a diode is formed are mounted on a chip mounting portion (lead frame). Meanwhile, a control chip (driver IC chip) on which a control circuit controlling the switching operation of the IGBT is formed, and a chip component (e.g. a passive component such as a gate resistance) are mounted on a wiring board (a substrate mounted on the chip mounting portion).

In case of such compositions, it is necessary to prepare a wiring board whose appearance shape in a plan view is relatively large in consideration of flatly mounting the control chip and the chip component on the surface of the wiring board. In other words, it is necessary to use a wiring board having an appearance shape size which is larger than at least a total area of the control chip and the chip component. The usage of such a wiring board as having a large appearance shape size means increase in the manufacturing cost of the semiconductor device.

Meanwhile, in recent years, a technique of achieving functions of a control chip and a chip component by using one semiconductor chip (electronic component) has been developed.

By using such a semiconductor chip, a semiconductor device including a plurality of electronic components (at least a control chip, an IGBT chip and a diode chip) can be manufactured without using a wiring board (see, for example, FIG. 1 of Patent Document 3).

Here, according to the above-described Patent Document 3, six IGBT chips are controlled by two control chips. That is, the three high-side IGBT chips are controlled by a high-side control chip, and the three low-side IGBT chips are controlled by a low-side control chip. In view of this, for example, when manufacture processes of the two control chips are varied, performances of the two control chips may be varied as well. More specifically, there is a risk of variation between a timing of the switching control for the high-side IGBTs and a timing of the switching control for the low-side IGBTs. That is, when the two control chips are used, there is a risk of decrease in controllability for the IGBTs. As a result, for example, the composition which uses a plurality of control chips described in Patent Document 3 has a matter to be improved from a viewpoint of improvement of performance of a semiconductor device.

In regard to this matter to be improved, for example, control of the switching operation of all IGBTs by one control chip as described in a related art below can be considered. Here, the "related art" described in the present description is a technique which has the problem newly found by the inventors, and is not a publicly-known conventional technique. However, the technique is a technique described so as to be intended as a technical premise (which is not a publicly-known technique) of a new technical idea.

Figure 7:
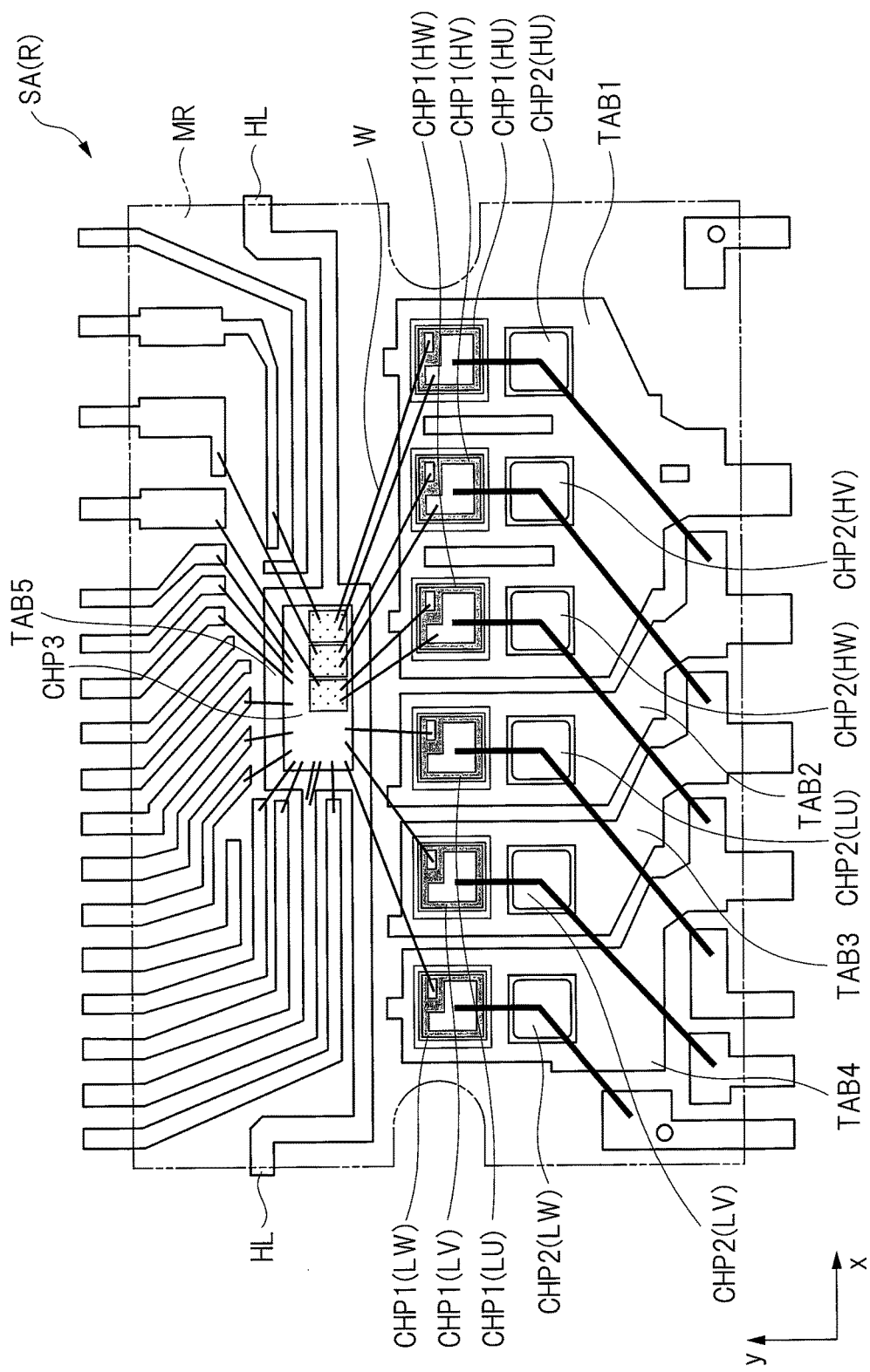
FIG. 7 is a plan view schematically illustrating a mounting composition example of a semiconductor device which achieves a three-phase inverter circuit according to related art.

FIG. 7 is a plan view schematically illustrating a mounting composition example of a semiconductor device SA (R) which achieves a three-phase inverter circuit according to the related art. As illustrated in FIG. 7, in the semiconductor device SA (R) according to the related art, chip mounting portions TAB1 to TAB4 are aligned in an x direction, and a chip mounting portion TAB5 is arranged on an upper side (y-direction side) of these chip mounting portions TAB1 to TAB4. Further, a semiconductor chip CHP1 (HU) on which the high-side IGBT corresponding to the U phase is formed, a semiconductor chip CHP1 (HV) on which the high-side IGBT corresponding to the V phase is formed, and a semiconductor chip CHP1 (HW) on which the high-side IGBT corresponding to the W phase is formed are mounted on the chip mounting portion TAB1. Furthermore, semiconductor chips CHP2 (HU), CHP2 (HV) and CHP2 (HW) on which respective diodes are formed are also mounted on the chip mounting portion TAB1.

Similarly, a semiconductor chip CHP1 (LU) on which the low-side IGBT corresponding to the U phase is formed, and a semiconductor chip CHP2 (LU) on which the diode is formed are mounted on the chip mounting portion TAB2. Further, a semiconductor chip CHP1 (LV) on which the low-side IGBT corresponding to the V phase is formed, and a semiconductor chip CHP2 (LV) on which the diode is formed are mounted on the chip mounting portion TAB3. Furthermore, a semiconductor chip CHP1 (LW) on which the low-side IGBT corresponding to the W phase is formed, and a semiconductor chip CHP2 (LW) on which the diode is formed are mounted on the chip mounting portion TAB4.

Meanwhile, a semiconductor chip CHP3 on which a gate control circuit of the three-phase inverter circuit is collectively formed is mounted on the chip mounting portion TAB5 coupled to a conductive member HL.

Here, when it is not necessary to distinguish a plurality of semiconductor chips on which the IGBTs composing the three-phase inverter circuit are formed, each chip will be referred to simply as "IGBT chip" in the present description. Similarly, when it is not necessary to distinguish a plurality of semiconductor chips on which the diodes composing the three-phase inverter circuit are formed, each chip will be referred to simply as "diode chip" in the present description.

In this case, as illustrated in FIG. 7, the semiconductor chip CHP3 and the six IGBT chips are electrically connected to each other via wires W. At this time, according to the related art illustrated in FIG. 7, the semiconductor chip CHP3 is arranged at a center of the x direction in which the six IGBT chips are aligned. In other words, the semiconductor chip CHP3 is arranged on a virtual line along the y direction passing between the third IGBT chip counted from the left and the fourth IGBT chip counted from the left among the six IGBT chips arranged along a long side of a sealing body MR (a side thereof extending along the x direction illustrated in FIG. 7). As a result, according to the related art, lengths of the wires W which couple the IGBT chips arranged at both ends with the semiconductor chip CHP3 increase. That is, according to the related art, each of the six IGBT chips arranged to align in the x direction, and one semiconductor chip CHP3 arranged at the center portion of the x direction are electrically connected to each other. In view of this, naturally, the length of the wire W which couple the semiconductor chip CHP1 (HU) arranged at one end portion with the semiconductor chip CHP3 and the length of the wire W1 which couple the semiconductor chip CHP1 (LW) arranged at the other end portion with the semiconductor chip CHP3 are the longest. Thus, when the lengths of the wires W increase, for example, a wire flow of the long wires W is easily caused in a resin sealing process of forming a sealing body because of a pressure produced by resin injection, and therefore, a risk of occurrence of a short-circuit fault between the adjacent wires W increases. Further, the increase in the lengths of the wires W means an increase in a parasitic resistance or a parasitic inductance of each wire W. Therefore, in this manner, there is a risk of deterioration of electrical characteristics of the semiconductor device.

That is, according to the related art, by forming the gate control circuit of the three-phase inverter circuit collectively on one semiconductor chip CHP3, the performance of the semiconductor device can be improved more than that in a technique which dispersedly forms the gate control circuits on a plurality of semiconductor chips and which is described in Patent Document 3. Meanwhile, according to the related art, a room for improvement which has not become obvious in conventional techniques becomes obvious. More specifically, as described above, it is necessary to electrically connect one semiconductor chip CHP3 with each of the six IGBT chips. As a result, there is the room for improvement from a viewpoint of the reliability of the semiconductor device and the electrical characteristics of the semiconductor device because of the increase in the lengths of some wires W of the plurality of wires W.

Here, in order to prevent the increase in the lengths of some wires W of the plurality of wires W in FIG. 7, change of a layout arrangement of the IGBT chips is considered. For example, the six IGBT chips is considered to be separately arranged along the circumference (the left side, the right side and the lower side in FIG. 7) of the semiconductor chip CHP3. In this case, distance between all IGBT chips and the semiconductor chip CHP3 can be small, and therefore, the lengths of the wires W can be decreased. However, when this layout arrangement is applied, an adverse effect of difficulty in drawing of the leads LD is caused. That is, in FIG. 7, the leads LD1 are arranged to surround the semiconductor chip CHP3, and the leads LD1 and the semiconductor chip CHP3 are coupled to each other via the wires W. However, when the six IGBT chips are separately arranged along the circumference of the semiconductor chip CHP3 (the left side, the right side and the lower side thereof in FIG. 7), the leads LD1 cannot be drawn to the vicinity of the semiconductor chip CHP3 because the six IGBT chips become an obstacle. In this case, it is necessary to form the wires W which couple the semiconductor chip CHP3 with the leads LD1 so as to extend beyond the IGBT chips. This means the increase in the lengths of the wires W which couple the semiconductor chip CHP3 with the leads LD1. That is, the layout for separately arranging the six IGBT chips along the circumference of the semiconductor chip CHP3 (the left side, the right side and the lower side thereof in FIG. 7) can shorten the length of each wire W which couples the semiconductor chip CHP3 with each IGBT chip but causes the difficulty in the drawing of the leads LD1. As a result, the layout causes the adverse effect of the increase in the lengths of the wires W which couple the semiconductor chip CHP3 with the leads LD1. In view of this, it is not effective to apply the layout arrangement for separately arranging the six IGBT chips along the circumference of the semiconductor chip CHP3 (the left side, the right side and the lower side thereof in FIG. 7) in order to shorten the length of each wire W. Hence, as illustrated in FIG. 7, it is necessary to make a device for suppressing the increase in the length of a part of wires W of the plurality of wires W while applying the layout for arranging the six IGBT chips along the x direction substantially on a line.

Hence, the present embodiment is devised to prevent the decrease in the reliability of the semiconductor device and the deterioration of the electrical characteristics of the semiconductor device due to the increase in the length of a part of wires W while assuming a composition of forming the gate control circuit of the three-phase inverter circuit collectively on one semiconductor chip CHP3, the composition arranging the six IGBT chips along the x direction substantially on a line as similar to the related art. A technical idea of the present embodiment which has been devised as described above will be described below with reference to the drawings.

<Composition of Semiconductor Device According to Embodiment>

<<Circuit Block Composition>>

Figure 8:
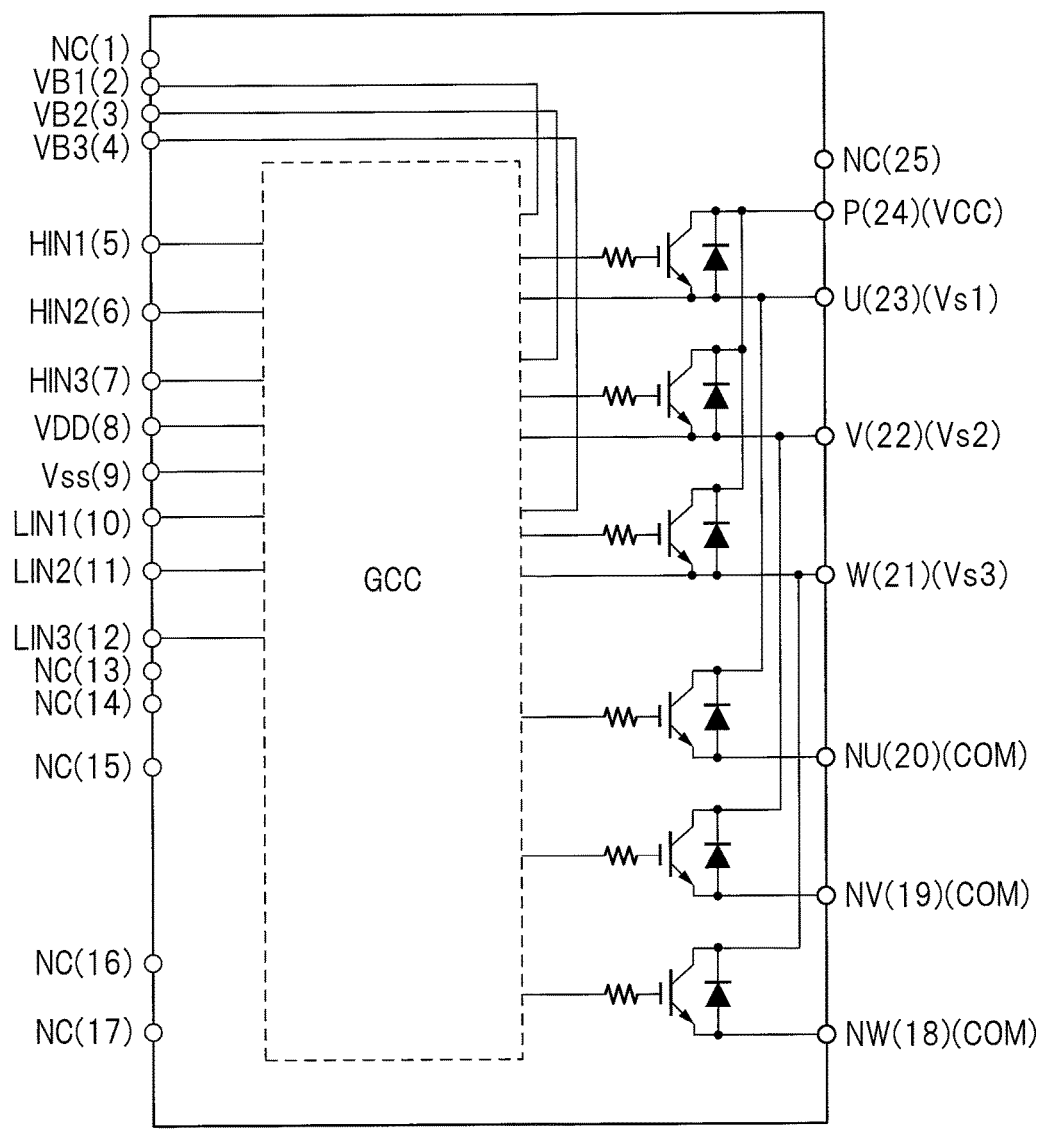
FIG. 8 is a view illustrating a circuit block composition of the semiconductor device according to the embodiment.

FIG. 8 is a view illustrating a circuit block composition of the semiconductor device according to the present embodiment. FIG. 8 illustrates a circuit block composition which achieves the inverter circuit INV illustrated in FIG. 1. In FIG. 8, the semiconductor device according to the present embodiment includes the six IGBTs, the six diodes and the gate control circuit GCC, and besides, includes 25 external terminals. The terminals whose numbers are 1, 13 to 17 and 25 are non-coupling terminals NC. Further, the terminals whose numbers are 2 to 4 are terminals VB1 to VB3 coupled with the gate control circuit GCC, and terminals whose numbers are 5 to 7 are terminals HIN1 to HIN3 which input signals to the gate control circuit GCC. Furthermore, the terminal whose number is 8 is the terminal VDD which supplies a low-voltage power supply to the gate control circuit GCC, and the terminal whose number is 9 is the terminal Vss which supplies a ground potential to the gate control circuit GCC. Still further, the terminals whose numbers are 10 to 12 are terminals LIN1 to LIN3 which input signals to the gate control circuit GCC. Meanwhile, a terminal whose number is 18 is a terminal NW (terminal COM) coupled with the ground potential, a terminal whose number is 19 is also a terminal NV (terminal COM) coupled with the ground potential, and a terminal whose number is 20 is also a terminal NU (terminal COM) coupled with the ground potential. Further, a terminal whose number 21 is a terminal W (terminal Vs3) coupled with the W phase of the three-phase motor, a terminal whose number is 22 is a terminal V (terminal Vs2) coupled with the V phase of the three-phase motor, and a terminal whose number is 23 is a terminal U (terminal Vs1) coupled with the U phase of the three-phase motor. Furthermore, a terminal whose number is 24 is a terminal P (terminal VCC) coupled with a high-voltage power supply.

Figure 9:
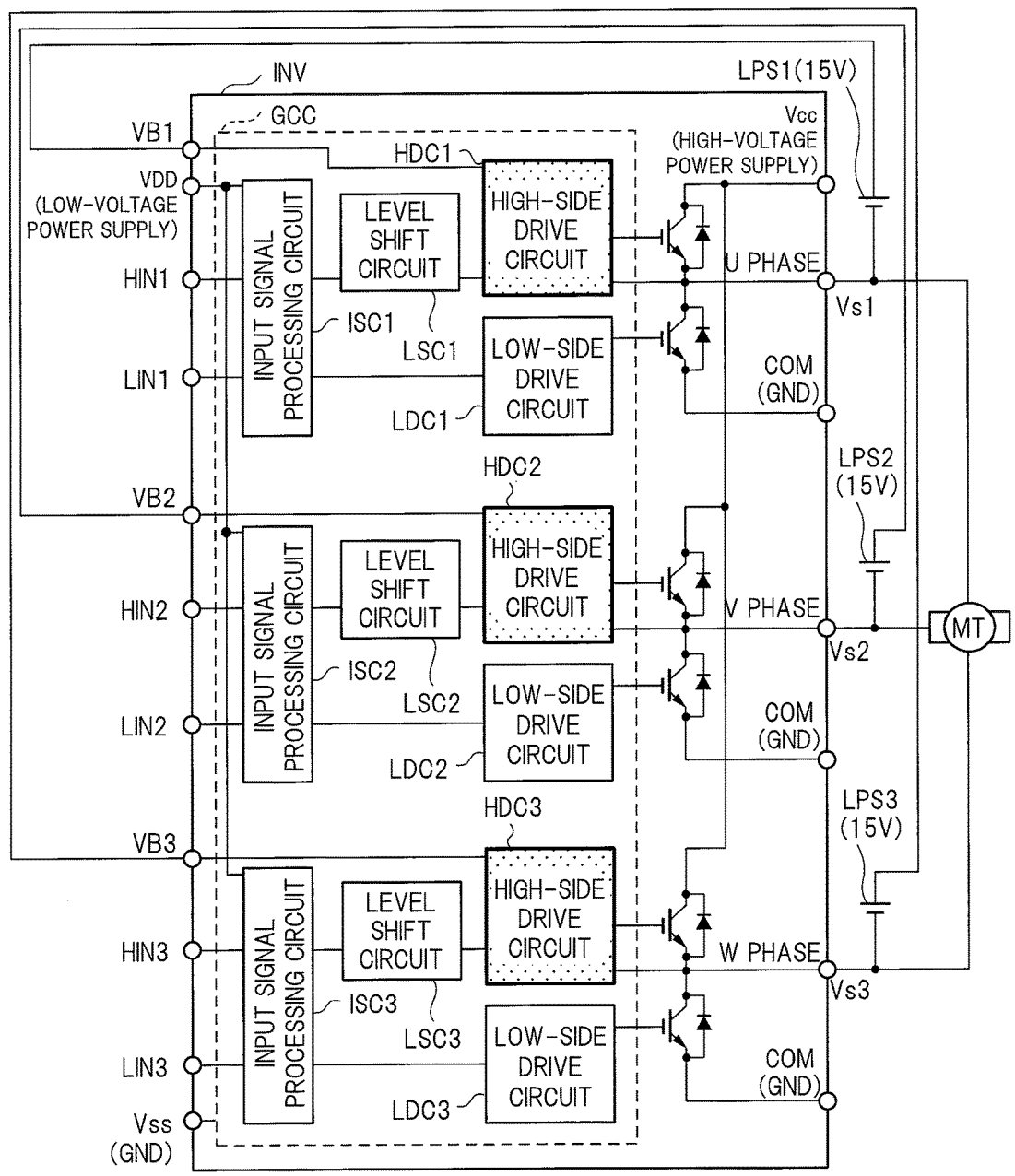
FIG. 9 is a view illustrating an internal block composition of the gate control circuit illustrated in FIG. 8.

FIG. 9 is a view illustrating an internal block composition of the gate control circuit GCC illustrated in FIG. 8. As illustrated in FIG. 9, in the gate control circuit GCC, a unit block composition illustrated in FIG. 6 is provided so as to correspond to each of the U phase, the V phase and the W phase. At this time, in FIG. 9, the unit block composition illustrated in FIG. 6 added with a symbol whose last number is "1" corresponds to the U phase, the unit block composition illustrated in FIG. 6 added with a symbol whose last number is "2" corresponds to the V phase, and the unit block composition illustrated in FIG. 6 added with a symbol whose last number is "3" corresponds to the W phase.

<<Composition of Semiconductor Chip which Embodies Gate Control Circuit>>

Figure 10:
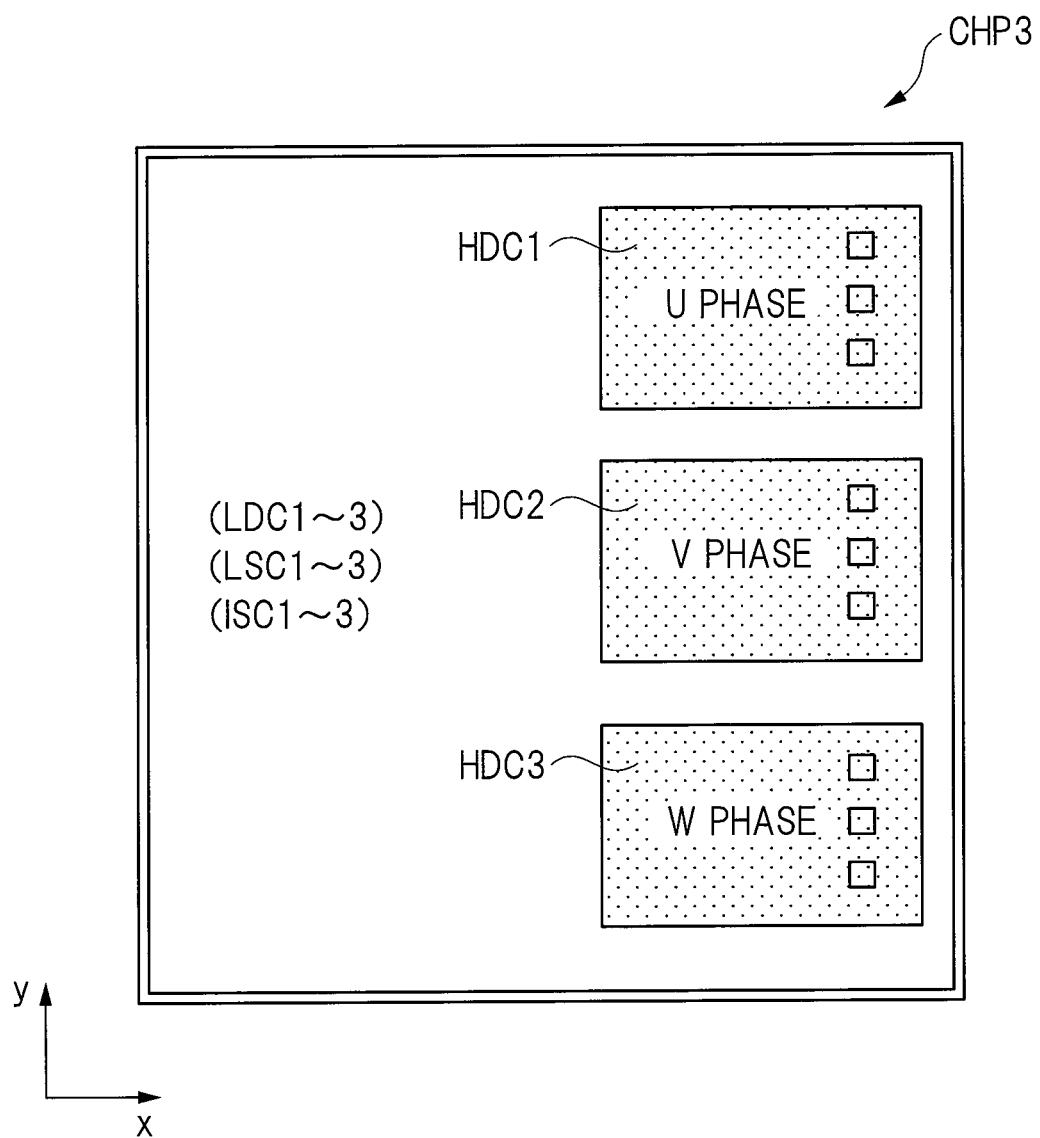
FIG. 10 is a schematic view illustrating a composition of a semiconductor chip which embodies the gate control circuit illustrated in FIG. 9.

FIG. 10 is a schematic view illustrating the composition of the semiconductor chip CHP3 which embodies the gate control circuit GCC illustrated in FIG. 9. As illustrated in FIG. 10, on the semiconductor chip CHP3, a "floating island structure" in which a high-side drive circuit HDC1 corresponding to the U phase is formed, a "floating island structure" in which a high-side drive circuit HDC2 corresponding to the V phase is formed, and a "floating island structure" in which a high-side drive circuit HDC3 corresponding to the W phase is formed are formed. At this time, on the semiconductor chip CHP3 according to the present embodiment, the three "floating island structures" are arranged in such a layout as aligning in the y direction. Further, low-side drive circuits LDC1 to 3, level shift circuits LSC1 to 3 and input signal processing circuits ISC 1 to 3 are formed in a region other than the "floating island structures".

By the semiconductor chip CHP3 according to the present embodiment composed as described above, the gate control circuit GCC composing the three-phase inverter circuit can be collectively formed on one semiconductor chip CHP3, and therefore, an advantage which can reduce the manufacturing cost of the semiconductor device composing the three-phase inverter circuit can be obtained. Further, it is not necessary to take into account the performance variations between the chips, and therefore, the controllability of the IGBT by the gate control circuit GCC can be improved by using the semiconductor chip CHP3 according to the present embodiment.

<<Mounting Composition of Semiconductor Device According to Embodiment>>

Figure 11:
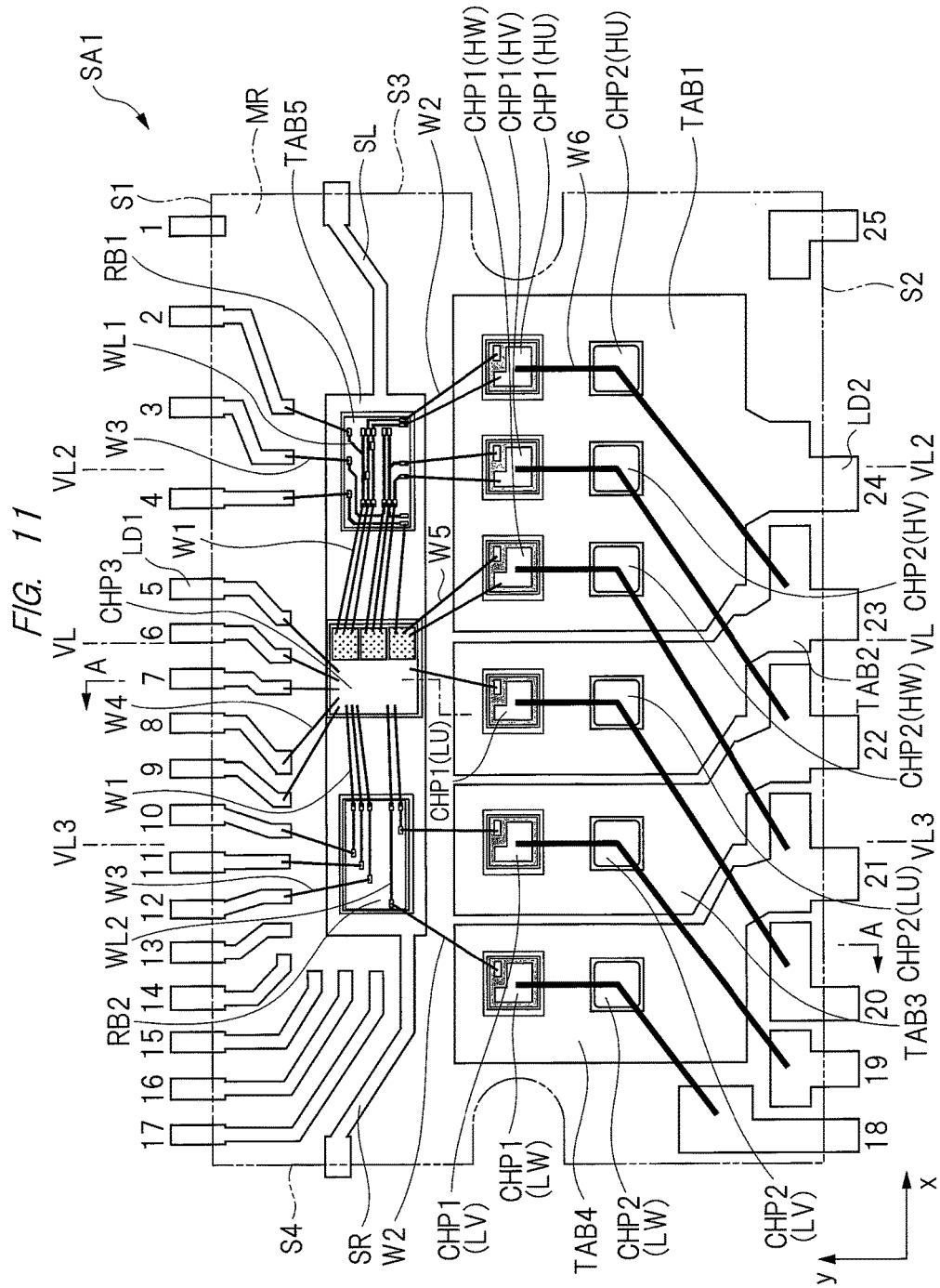
FIG. 11 is a plan view schematically illustrating a mounting composition of the semiconductor device according to the embodiment.
Figure 12:
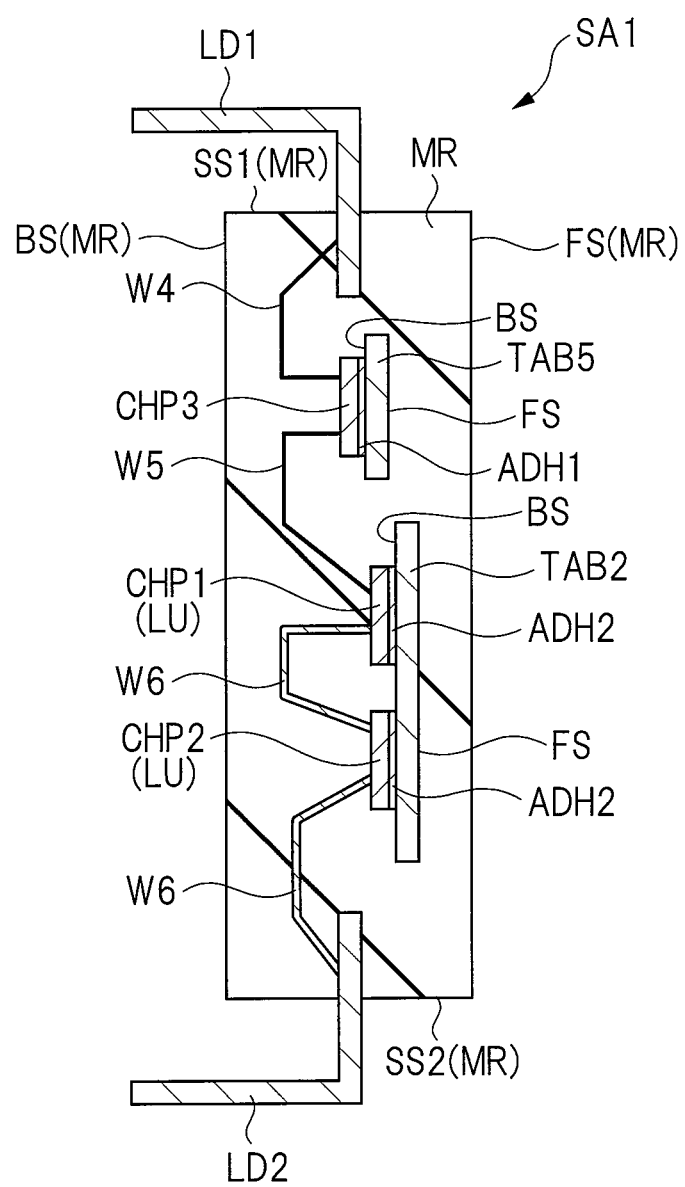
FIG. 12 is a cross-sectional view taken along a line A-A in FIG. 11.

Next, the mounting composition of the semiconductor device according to the present embodiment will be described. FIG. 11 is a plan view schematically illustrating a mounting composition of the semiconductor device SA1 according to the present embodiment. In FIG. 11, for example, note that a view of the sealing body MR comprised of quadrangle is a perspective view. In FIG. 11, the semiconductor device SA1 according to the present embodiment includes the sealing body MR comprised of quadrangle, this sealing body MR includes a side S1, a side S2 facing this side S1, a side S3 intersecting the side S1 and the side S2, and a side S4 facing the side S3, and a back surface of the sealing body MR is formed by these sides S1 to S4. That is, FIG. 11 is a plan view which is viewed from the back surface side of the sealing body MR, the plan view being viewed from a left side in FIG. 12, that is, the back surface BS side of the chip mounting portion TAB2 on which the semiconductor chips CHP1 (LU) and CHP2 (LU) are mounted and a back surface BS (MR) side of the sealing body MR positioned on the back surface BS side of the chip mounting portion TAB5 on which the semiconductor chip CHP3 is mounted. Further, as illustrated in FIG. 12, a surface opposite to this back surface BS (MR) is a front surface FS (MR) of the sealing body MR, and surfaces sandwiched between the back surface BS (MR) and the front surface FS (MR) are a side surface SS1 (MR) and a side surface SS2 (MR). A this time, when the semiconductor device SA1 is mounted on the mounting substrate, the back surface BS (MR) of the sealing body MR is a surface facing a surface of the mounting substrate on which the semiconductor device SA1 is mounted.

Next, the semiconductor device SA1 according to the present embodiment includes the chip mounting portion TAB1, the chip mounting portion TAB2, the chip mounting portion TAB3 and the chip mounting portion TAB4 arranged to align in a "−x" direction. Further, in the present embodiment, a plurality of leads LD2 (second lead group) is arranged along the side S2 of the sealing body MR facing the side S1 in plan view.

The chip mounting portions TAB1 to TAB4 are electrically connected with the leads LD2, respectively, and integrally formed with the leads LD2. Each lead LD2 protrudes from the second side (side surface) of the sealing body MR, and a plurality of leads LD2 also include, for example, a ground lead which can supply a GND potential (ground potential) in addition to the leads LD2 integrally formed with the chip mounting portions TAB1 to TAB4, respectively. That is, numbers 18 to 25 illustrated in FIG. 11 compose the lead LD2, respectively. Particularly, the numbers 18 to 20 are the ground leads, respectively, and the number 21 is the lead LD2 coupled with the W phase, the number 22 is the lead LD2 coupled with the V phase, and the number 23 is the lead LD2 coupled with the U phase. Further, the number 24 is the lead LD2 which can supply a power supply potential, and the number 25 is a non-coupling lead which is not electrically connected with any component.

Meanwhile, the chip mounting portion TAB5 is arranged on a "+y" direction side of the chip mounting portions TAB1 to TAB4 aligned in the x direction. Further, this chip mounting portion TAB5 is fixed by a support lead SL. Furthermore, as illustrated in, for example, FIG. 11, a plurality of leads LD1 (first lead group) are arranged along the side S1 of the sealing body MR in plan view. A plurality of leads LD1 protrudes from the side S1 of the sealing body MR, and the 17 leads LD1 denoted by numbers 1 to 17 are provided in FIG. 11.

As described above, as illustrated in FIG. 11, in plan view, the chip mounting portion TAB5 is arranged between a plurality of leads (lead group) LD1 arranged to align in the x direction and a plurality of leads (lead group) LD2 arranged to align in the x direction while being distant from the plurality of leads LD1 in the y direction. Further, as illustrated in FIG. 11, in plan view, a plurality of chip mounting portions TAB1 to TAB4 are arranged to align in the x direction in a portion between a plurality of leads (lead group) LD1 and a plurality of leads (lead group) LD2, the portion being between the chip mounting portion TAB5 and the plurality of leads (lead groups) LD2.

Subsequently, as illustrated in FIG. 11, on the chip mounting portion TAB1, the semiconductor chip CHP1 (HU) on which the high-side IGBT corresponding to the U phase is formed, the semiconductor chip CHP1 (HV) on which the high-side IGBT corresponding to the V phase is formed, and the semiconductor chip CHP1 (HW) on which the high-side IGBT corresponding to the W phase is formed are mounted. Further, on the chip mounting portion TAB1, the semiconductor chip CHP2 (HU), the semiconductor chip CHP2 (HV) and the semiconductor chip CHP2 (HW) on which the diodes are formed, respectively, are also mounted.

Similarly, on the chip mounting portion TAB2, the semiconductor chip CHP1 (LU) on which the low-side IGBT corresponding to the U phase is formed, and the semiconductor chip CHP2 (LU) on which the diode is formed are mounted. Further, on the chip mounting portion TAB3, the semiconductor chip CHP1 (LV) on which the low-side IGBT corresponding to the V phase is formed, and the semiconductor chip CHP2 (LV) on which the diode is formed are mounted. Furthermore, on the chip mounting portion TAB4, the semiconductor chip CHP1 (LW) on which the low-side IGBT corresponding to the W phase is formed, and the semiconductor chip CHP2 (LW) on which the diode is formed are mounted.

At this time, the six IGBT chips of the semiconductor chip CHP1 (HU), the semiconductor chip CHP1 (HV), the semiconductor chip CHP1 (HW), the semiconductor chip CHP1 (LU), the semiconductor chip CHP1 (LV) and the semiconductor chip CHP1 (LW) are arranged substantially on a line along the side S2 of the sealing body MR as illustrated in FIG. 11. Similarly, the six diode chips of the semiconductor chip CHP2 (HU), the semiconductor chip CHP2 (HV), the semiconductor chip CHP2 (HW), the semiconductor chip CHP2 (LU), the semiconductor chip CHP2 (LV) and the semiconductor chip CHP2 (LW) are arranged substantially on a line along the side S2 of the sealing body MR as illustrated in FIG. 11. Further, the planar shape of each IGBT chip is quadrangular, and an appearance shape size of each IGBT chip is, for example, 3.0 mm×3.0 mm. On the other hand, the planar shape of each diode chip is quadrangular, and an appearance shape size of each diode chip is, for example, 2.5 mm×2.5 mm As illustrated in FIG. 11, note that the IGBT chip mounted on each of the chip mounting portions TAB1 to TAB4 includes an IGBT (power transistor), and includes a front surface on which the gate electrode pad electrically connected with the gate electrode of the IGBT is arranged. A front surface of this IGBT chip is a surface opposing to a back surface of the sealing body MR.

Next, as illustrated in FIG. 11, on the chip mounting portion TAB5, the semiconductor chip CHP3 on which the gate control circuit for controlling an on/off operation (switching operation) of the IGBT is formed is mounted, and a relay board is arranged adjacent to this semiconductor chip CHP3 in plan view. This relay board is made of, for example, the same material as a material forming a PCB (Printed Circuit Board), or silicon which is the same material as that of the semiconductor chip CHP, and a plurality of wiring are formed on this relay board. That is, this relay board is the wiring board on which a plurality of wiring are formed.

More specifically, as illustrated in FIG. 11, for example, there are two relay boards, a high-side relay board RB1 which is one relay board is arranged at a right position of the semiconductor chip CHP3, and a low-side relay board RB2 which is the other relay board is arranged at a left position of the semiconductor chip CHP3. Hence, in plan view, the semiconductor chip CHP3 is arranged between the high-side relay board RB1 and the low-side relay board RB2. In other words, in plan view, the high-side relay board RB1 and the low-side relay board RB2 are arranged so as to sandwich the semiconductor chip CHP3. Note that the planar shape of the semiconductor chip CHP3 is quadrangular, and an appearance shape size of the semiconductor chip CHP3 is, for example, 3.5 mm×3.5 mm. On the other hand, each planar shape of the high-side relay board RB1 and the low-side relay board RB2 is quadrangular, and an appearance shape size of each of the high-side relay board RB1 and the low-side relay board RB2 is, for example, 4.5 mm×3.0 mm.

Here, for example, a plurality of wiring WL1 are formed on the high-side relay board RB1, and a plurality of wiring WL2 are formed on the low-side relay board RB2. At this time, as illustrated in, for example, FIG. 11, a wiring pattern of a plurality of wiring WL1 formed on the high-side relay board RB1 is different from a wiring pattern of a plurality of wiring WL2 formed on the low-side relay board RB2. However, the wiring pattern of the plurality of wiring WL1 formed on the high-side relay board RB1 and the wiring pattern of the plurality of wiring WL2 formed on the low-side relay board RB2 can be equal to each other.

Note that the semiconductor chip CHP3 mounted on the chip mounting portion TAB5 includes the gate control circuit which controls the gate electrode of the IGBT formed on the IGBT chip, and includes a front surface in which the electrode pad electrically connected with this gate control circuit is arranged. The front surface of this semiconductor chip CHP3 is a surface opposing to the back surface of the sealing body MR.

In the semiconductor device SA1 according to the present embodiment as illustrated in FIG. 11, the three high-side semiconductor chips of the semiconductor chip CHP1 (HU), the semiconductor chip CHP1 (HV) and the semiconductor chip CHP1 (HW) are arranged on one region side (right region) of regions, the regions are separated by a virtual line VL as a boundary in plan view, and the virtual line extends in a direction (y direction) intersecting with the side S1 and the side S2 of the sealing body MR. On the other hand, as illustrated in FIG. 11, the three low-side semiconductor chips of the semiconductor chip CHP1 (LU), the semiconductor chip CHP1 (LV) and the semiconductor chip CHP1 (LW) are arranged on the other region side (left region) of the regions, and the regions are separated by the virtual line VL as the boundary in plan view. Further, as illustrated in FIG. 11, in plan view, the semiconductor chip CHP3 arranged on the chip mounting portion TAB5 is arranged on the virtual line VL. In other words, the semiconductor chip CHP3 is arranged on the virtual line VL along the y direction passing between the third IGBT chip (semiconductor chip CHP1 (LU)) counted from the left and the fourth IGBT chip (semiconductor chip CHP1 (LU)) counted from the left among the six IGBT chips arranged along the long side (the side S2 extending along the x direction illustrated in FIG. 11) of the sealing body MR. Further, in plan view, the high-side relay board RB1 is arranged on the one region side (right region) of the regions separated by the virtual line VL as the boundary. In other words, the high-side relay board RB1 is arranged on the virtual line VL2 along the y direction passing through the second IGBT chip (semiconductor chip CHP1 (HV)) counted from the right among the six IGBT chips arranged along the long side (the side S2 extending along the x direction illustrated in FIG. 11) of the sealing body MR. Further, in plan view, the low-side relay board RB2 is arranged on the one region side (left region) of the regions separated by the virtual line VL as the boundary. In other words, the low-side relay board RB2 is arranged on a virtual line VL3 along the y direction passing through the second IGBT chip (semiconductor chip CHP1 (LV)) counted from the left among the six IGBT chips arranged along the long side (the side S2 extending along the x direction illustrated in FIG. 11) of the sealing body MR.

Subsequently, as illustrated in FIG. 11, the semiconductor chip CHP3 and some of a plurality of leads LD1 are electrically connected to each other. Further, the semiconductor chip CHP3 and each of a plurality of IGBT chips are electrically connected to each other. Furthermore, a plurality of IGBT chips and some of a plurality of leads LD2 are electrically connected to each other.

This connection relation will be specifically described below. In FIG. 11, for example, the semiconductor chip CHP3 and the leads LD1 corresponding to number 5 to number 9 are electrically connected directly via wires W4. Meanwhile, the semiconductor chip CHP3 and the leads LD1 corresponding to number 2 to number 4 are electrically connected with each other via the wires W1 which couple the semiconductor chip CHP3 and the wiring WL1 of the high-side relay board RB1, the wiring WL1 of the high-side relay board RB1, and wires W3 which couple the wiring WL1 of the high-side relay board RB1 and the leads LD1. Further, the semiconductor chip CHP3 and the leads LD1 corresponding to number 10 to number 12 are electrically connected with each other via the wires W1 which couple the semiconductor chip CHP3 and the wiring WL2 of the low-side relay board RB2, the wiring WL2 of the low-side relay board RB2, and the wires W3 which couple the wiring WL2 of the low-side relay board RB2 and the leads LD1. Hence, it can be said that, in the present embodiment, the semiconductor chip CHP3 and at least one lead LD1 of a plurality of leads LD1 are electrically connected to each other via the plurality of wires W1 and W3 and the relay board.

Next, in FIG. 11, the semiconductor chip CHP1 (HW) and the semiconductor chip CHP3 are electrically connected with each other directly via wires W5, and the semiconductor chip CHP1 (LU) and the semiconductor chip CHP3 are electrically connected with each other directly via the wires W5. On the other hand, the semiconductor chip CHP1 (HU) and the semiconductor chip CHP3 are electrically connected with each other via the wires W1 which couple the semiconductor chip CHP3 and the wiring WL1 of the high-side relay board RB1, the wiring WL1 of the high-side relay board RB1, and wires W2 which couple the wiring WL1 of the high-side relay board RB1 and the semiconductor chip CHP1 (HU). Further, the semiconductor chip CHP1 (HV) and the semiconductor chip CHP3 are also electrically connected with each other via the wires W1 which couple the semiconductor chip CHP3 and the wiring WL1 of the high-side relay board RB1, the wiring WL1 of the high-side relay board RB1, and the wires W2 which couple the wiring WL1 of the high-side relay board RB1 and the semiconductor chip CHP1 (HV).

On the other hand, the semiconductor chip CHP1 (LV) and the semiconductor chip CHP3 are electrically connected with each other via the wires W1 which connect the semiconductor chip CHP3 and the wiring WL2 of the low-side relay board RB2, the wiring WL2 of the low-side relay board RB2, and the wires W2 which connect the wiring WL2 of the low-side relay board RB2 and the semiconductor chip CHP1 (LV). Further, the semiconductor chip CHP1 (LW) and the semiconductor chip CHP3 are also electrically connected with each other via the wires W1 which connect the semiconductor chip CHP3 and the wiring WL2 of the low-side relay board RB2, the wiring WL2 of the low-side relay board RB2, and the wires W2 which connect the wiring WL2 of the low-side relay board RB2 and the semiconductor chip CHP1 (LW).

More specifically, as illustrated in FIG. 11, the semiconductor chip CHP3 and at least one high-side semiconductor chip of the three high-side semiconductor chips (semiconductor chips CHP1 (HU), CHP1 (HV) and CHP1 (HW)) are electrically connected with each other via two paths described below. That is, at least one high-side semiconductor chip and the semiconductor chip CHP3 are connected via one path which passes through the wires W1 which connect the semiconductor chip CHP3 and the high-side relay board RB1, the high-side relay board RB1, and the wires W2 which connect the high-side relay board RB1 and the gate electrode pad of the high-side semiconductor chip. Further, at least one high-side semiconductor chip and the semiconductor chip CHP3 are connected also via another path which passes through the wires W1 which connect the semiconductor chip CHP3 and the high-side relay board RB1, the high-side relay board RB1, and the wires W2 which connect the high-side relay board RB1 and the emitter electrode pad of the high-side semiconductor chip.

Meanwhile, the semiconductor chip CHP3 and at least one low-side semiconductor chip of the three low-side semiconductor chips (the semiconductor chips CHP1 (LU), CHP1 (LV) and CHP1 (LW)) are electrically connected with each other via one path described below. That is, at least one low-side semiconductor chip and the semiconductor chip CHP3 are electrically connected with each other via the wires W1 which connect the semiconductor chip CHP3 and the low-side relay board RB2, the low-side relay board RB2, and the wires W2 which connect the low-side relay board RB2 and the gate electrode pad of the low-side semiconductor chip.

As described above, as illustrated in FIG. 11, in the semiconductor device SA1 according to the present embodiment, the semiconductor chip CHP3 and at least one IGBT chip of the six IGBT chips are electrically connected with each other via the plurality of the wires W1 and W2 and the relay boards.

Subsequently, as illustrated in FIG. 11, in the semiconductor device SA1 according to the present embodiment, each of the six IGBT chips, each of the six diode chips and the lead LD2 are integrally connected via wires W6. More specifically, as illustrated in FIG. 11, the emitter electrode pad of the semiconductor chip CHP1 (HU), the anode electrode pad of the semiconductor chip CHP2 (HU) and the lead LD2 whose number is 23 are integrally connected via one wire W6, and the emitter electrode pad of the semiconductor chip CHP1 (HV), the anode electrode pad of the semiconductor chip CHP2 (HV) and the lead LD2 whose number is 22 are integrally connected via one wire W6. Similarly, the emitter electrode pad of the semiconductor chip CHP1 (HW), the anode electrode pad of the semiconductor chip CHP2 (HW) and the lead LD2 whose number is 21 are integrally connected via one wire W6, and the emitter electrode pad of the semiconductor chip CHP1 (LU), the anode electrode pad of the semiconductor chip CHP2 (LU) and the lead LD2 whose number is 20 are integrally connected via one wire W6. Further, the emitter electrode pad of the semiconductor chip CHP1 (LV), the anode electrode pad of the semiconductor chip CHP2 (LV) and the lead LD2 whose number is 19 are integrally connected via one wire W6, and the emitter electrode pad of the semiconductor chip CHP1 (LW), the anode electrode pad of the semiconductor chip CHP2 (LW) and the lead LD2 whose number is 18 are integrally connected via one wire W6.

Here, while each of the wires W1 to W5 is formed by a gold wire or a copper wire, the wire W6 is formed by, for example, an aluminum wire, and the diameter of each of the wires W1 to W5 is smaller than the diameter of the wire W6. In other words, the diameter of the wire W6 is larger than the diameter of each of the wires W1 to W5. As a specific example, the diameter of each of the wires W1 to W5 is about 30 μm, and the diameter of the wire W6 is about 300 μm.

Next, FIG. 12 is a cross-sectional view taken along a line A-A in FIG. 11. In FIG. 12, the chip mounting portion TAB5 is arranged an inside portion sealed by the sealing body MR, and the semiconductor chip CHP3 is mounted on the back surface BS of this chip mounting portion TAB5 via an adhesive member ADH1. Further, the chip mounting portion TAB2 is arranged in the inside portion sealed by the sealing body MR, and the semiconductor chip CHP1 (LU) and the semiconductor chip CHP2 (LU) are mounted on the back surface BS of this chip mounting portion TAB2 via an adhesive member ADH2. As illustrated in FIGS. 11 and 12, note that the semiconductor chip CHP2 (LU) is arranged adjacent to the semiconductor chip CHP1 (LU).

Further, a part of the leads LD1 and a part of the leads LD2 protrude from the sealing body MR. More specifically, the sealing body MR includes the front surface FS (MR) positioned on the front surface FS (the surface opposite to the back surface BS) side of the chip mounting portions TAB2 and TAB5, the back surface BS (MR) opposite to this front surface FS (MR) (a surface positioned on the back surface side BS of the chip mounting portions TAB2 and TAB5), and the side surfaces SS1 (MR) and SS2 (MR) positioned between the front surface FS (MR) and the back surface BS (MR). Further, the lead LD1 protrudes from the side surface SS1 (MR,) and besides, is bent toward the back surface BS (MR) side of the sealing body MR in an outside portion of the sealing body MR. On the other hand, the lead LD2 protrudes from the side surface SS2 (MR) opposite to the side surface SS1 (MR) from which the lead LD1 protrudes, and besides, is bent toward the back surface BS (MR) side of the sealing body MR in the outside portion of the sealing body MR.

Further, the lead LD1 and the semiconductor chip CHP3 are electrically connected via the wire (copper wire) W4, and the semiconductor chip CHP3 and the semiconductor chip CHP1 (LU) are electrically connected via the wire (copper wire) W5. Furthermore, the semiconductor chip CHP1 (LU) and the semiconductor chip CHP2 (LU) are electrically connected via the wire (aluminum wire) W6, and the semiconductor chip CHP2 (LU) and the lead LD2 are electrically connected via the wire (aluminum wire) W6.

Here, the adhesive member ADH1 and the adhesive member ADH2 may be made of adhesive members of the same type as each other or may be made of adhesive members of different types from each other.

As described above, the semiconductor device SA1 according to the present embodiment is composed to be mounted.

Features of Embodiment

Next, the feature of the present embodiment will be described. The features of the present embodiment lies in that a first electronic component and a part of second electronic components of a plurality of second electronic components are electrically connected with each other via a first wire which connects the first electronic component and a substrate, the substrate, and a second wire which connects the substrate and the second electronic component. That is, the feature of the present embodiment lies in that the first electronic component and the part of the second electronic components of the plurality of second electronic components are electrically connected with each other via a wiring formed on the relay boards.

More specifically, as illustrated in, for example, FIG. 11, the semiconductor chip CHP3 (first electronic component) on which the control circuit for controlling the on/off operation of the IGBT is formed and the semiconductor chip CHP1 (HU) (second electronic component) of the plurality of IGBT chips are electrically connected via the high-side relay board RB1. That is, the semiconductor chip CHP1 (HU) and the semiconductor chip CHP3 are electrically connected via the wire W1, the high-side relay board RB1 and the wire W2. Similarly, as illustrated in, for example, FIG. 11, the semiconductor chip CHP3 on which the control circuit for controlling the on/off operation of the IGBT is formed and the semiconductor chip CHP1 (LW) of the plurality of IGBT chips are electrically connected via the low-side relay board RB2. That is, the semiconductor chip CHP1 (LW) and the semiconductor chip CHP3 are electrically connected via the wire W1, the low-side relay board RB2 and the wire W2. Consequently, by the semiconductor device SA1 according to the present embodiment, the following advantages can be obtained.

(1) For example, the semiconductor device SA (R) according to the related art illustrated in FIG. 7 applies a composition in which one semiconductor chip CHP3 and each of the six IGBT chips aligned on a line along the x direction are directly connected via the wire W. In a case of this composition, as illustrated in, for example, FIG. 7, the length of the wire W used to connect the semiconductor chip CHP3 with the semiconductor chip CHP1 (HU) distant from the semiconductor chip CHP3 adversely increases. Thus, the increase in the length of the wire W is easy to cause a wire flow of the long wire W due to, for example, a pressure of resin injection in a resin sealing process of forming the sealing body, and has a risk of occurrence of a short-circuit fault between the adjacent wires W. Further, the increase in the length of the wire W means increase in the parasitic resistance and the parasitic inductance of the wire W, and therefore, the electrical characteristics of the semiconductor device are deteriorated. That is, the composition described in the related art in which one semiconductor chip CHP3 and each of the six IGBT chips are directly connected via the wire W causes the decrease in reliability of the semiconductor device SA (R) and the deterioration of the electrical characteristics thereof due to the increase in the length of some wires W of the plurality of wires W.

On the other hand, as illustrated in, for example, FIG. 11, in the semiconductor device SA1 according to the present embodiment, the high-side relay board RB1 and the low-side relay board RB2 are arranged adjacent to the semiconductor chip CHP3 on the chip mounting portion TAB5 on which the semiconductor chip CHP3 is mounted. Further, the semiconductor chip CHP3 and the semiconductor chip CHP1 (HU) which is distant from the semiconductor chip CHP3 are electrically connected via not directly the wire but the wire W1 which connects the semiconductor chip CHP3 and the high-side relay board RB1, the high-side relay board RB1, and the wire W2 which connects the high-side relay board RB1 and the semiconductor chip CHP1 (HU). Similarly, the semiconductor chip CHP3 and the semiconductor chip CHP1 (LW) which is distant from the semiconductor chip CHP3 are electrically connected via not directly the wire but the wires W1 which connect the semiconductor chip CHP3 and the low-side relay board RB2, the low-side relay board RB2, and the wires W2 which connect the low-side relay board RB2 and the semiconductor chip CHP1 (LW).

In this manner, according to the present embodiment, the lengths of the wires W1 and the wires W2 can be shorter than the lengths in the composition in which the semiconductor chip CHP3 and the semiconductor chip CHP1 (HU) are connected directly via the wires. Similarly, according to the present embodiment, the lengths of the wires W1 and the wires W2 can be shorter than the lengths in the composition in which the semiconductor chip CHP3 and the semiconductor chip CHP1 (LW) are connected directly via the wires. As a result, according to the present embodiment, a short-circuit fault and an increase in a parasitic resistance and a parasitic inductance due to a wire flow caused by an increase in the wire lengths can be suppressed. Thus, according to the features of the present embodiment, by interposing the high-side relay board RB1 and the low-side relay board RB2 into the connection between the semiconductor chip CHP3 which is the control chip and each IGBT chip, the wire lengths can be shortened, and therefore, the reliability and performance of the semiconductor device SA1 can be improved.

(2) Further, according to the present embodiment, for example, the semiconductor chip CHP3 and the lead LD1 whose number is 2 and which is distant from the semiconductor chip CHP3 are electrically connected via not directly the wires but the wires W1 which connect the semiconductor chip CHP3 and the high-side relay board RB1, the high-side relay board RB1, and the wires W3 which connect the high-side relay board RB1 and the lead LD2. Similarly, for example, the semiconductor chip CHP3 and the lead LD1 whose number is 12 and which is distant from the semiconductor chip CHP3 are electrically connected via not directly the wires but the wires W1 which connect the semiconductor chip CHP3 and the low-side relay board RB2, the low-side relay board RB2, and the wires W3 which connect the low-side relay board RB2 and the lead LD1.

In this manner, according to the present embodiment, the lengths of the wires W1 and the wires W3 can be shorter than the lengths in the composition in which the semiconductor chip CHP3 and the lead LD1 whose number is 2 are connected directly via the wires. Similarly, according to the present embodiment, the lengths of the wires W1 and the wires W3 can be shorter than the lengths in the composition in which the semiconductor chip CHP3 and the lead LD1 whose number is 12 are connected directly via the wires. As a result, according to the present embodiment, a short-circuit fault and an increase in a parasitic resistance and a parasitic inductance due to a wire flow caused by an increase in the wire lengths can be suppressed. Thus, according to the features of the present embodiment, by interposing the high-side relay board RB1 and the low-side relay board RB2 into the connection between the semiconductor chip CHP3 which is the control chip and a part of the leads LD1, the wire lengths can be shortened, and therefore, the reliability and performance of the semiconductor device SA1 can be improved.

Thus, according to the features of the present embodiment, the high-side relay board RB1 and the low-side relay board RB2 are interposed into not only the connection between the semiconductor chip CHP3 and the part of the IGBT chips but also the connection between the semiconductor chip CHP3 and the part of the leads LD1. As a result, according to the present embodiment, it is possible to not only shorten the lengths of the wires (W1 and W2) which connect the semiconductor chip CHP3 and part of the IGBT chips but also shorten the lengths of the wires (W1 and W3) which connect the semiconductor chip CHP3 and the part of the leads LD1. Therefore, also in view of this point, according to the present embodiment, the reliability and the performance of the semiconductor device SA1 can be improved.

(3) Particularly, according to the present embodiment, by using the high-side relay board RB1 and the low-side relay board RB2 to connect the semiconductor chip CHP3 and the part of the leads LD1, it is possible to not only shorten the lengths of the wires (W1 and W3) but also shorten the lengths of the leads LD1. This point will be described below.

For example, according to the related art illustrated in FIG. 7, in order to shorten the wires W which connect the leads LD1 and the semiconductor chip CHP3, the leads LD1 are extended to the vicinity of the chip mounting portion TAB5 on which the semiconductor chip CHP3 is mounted. In this case, the length of each lead LD1 increases. The increase in the length of each lead LD1 tends to deform the lead LD1 because of a resin injection pressure in the resin sealing process and an external force in a conveying process, and therefore, there is a risk of a decrease in bondability in a wire bonding process. That is, the increase in the length of each lead LD1 causes a decrease in the reliability of the semiconductor device SA1.

In regard to this point, according to the present embodiment, as illustrated in FIG. 11, a planar size of the chip mounting portion TAB5 on which the semiconductor chip CHP3 is mounted is increased to arrange the high-side relay board RB1 and the low-side relay board RB2. Therefore, according to the present embodiment, it is possible to arrange the leads LD1 in the vicinity of the circumference of the chip mounting portion TAB5 without increasing the length of each lead LD1 compared to the related art. This means that the length of each lead LD1 can be shortened by the present embodiment. As a result, according to the present embodiment, the deformation of each lead LD1 due to the increase in the length of each lead LD1 can be suppressed. In this manner, the decrease in the bondability in the wire bonding process can be suppressed. That is, according to the present embodiment, the reliability of the semiconductor device SA1 can be improved not only because the lengths of the wires (W1, W2 and W3) can be shortened but also because the length of each lead LD1 can be shortened.

(4) For example, the chip mounting portion TAB5 itself on which the semiconductor chip CHP3 is mounted may be formed by a wiring board having a large area. However, in a case of this composition, a wiring board having a large planar size is required in addition to a lead frame, and this case causes a rise in a semiconductor device manufacturing cost. On this other hand, according to the present embodiment, as illustrated in FIG. 11, based on the usage of the chip mounting portion TAB5 which composes the lead frame, the semiconductor chip CHP3 is mounted on this chip mounting portion TAB5, and besides, the high-side relay board RB1 and the low-side relay board RB2 are arranged. In this case, the sizes of the high-side relay board RB1 and the low-side relay board RB2 themselves can be reduced at the minimum, so that the rise in manufacturing cost of the semiconductor device SA1 can be suppressed. That is, the present embodiment employs not the composition in which the chip mounting portion TAB5 itself is formed of a large wiring board but a composition in which the small high-side relay board RB1 and low-side relay board RB2 are arranged adjacent to the semiconductor chip CHP3 and on the chip mounting portion TAB5. As a result, according to the present embodiment, the sizes of the high-side relay board RB1 and the low-side relay board RB2 can be reduced, and therefore, the manufacturing costs of the high-side relay board RB1 and the low-side relay board RB2 are low. In this manner, the rise in the manufacturing cost of the semiconductor device SA1 can be suppressed.

(5) Further, according to the present embodiment, the chip mounting portion TAB5 and the semiconductor chip CHP3 are adhered by the adhesive member, the chip mounting portion TAB5 and the high-side relay board RB1 are adhered by the adhesive member, and the chip mounting portion TAB5 and the low-side relay board RB2 are adhered by the adhesive member. At this time, for example, the adhesive member which adheres the chip mounting portion TAB5 and the semiconductor chip CHP3 and the adhesive member which adheres the chip mounting portion TAB5 and the high-side relay board RB1 (low-side relay board RB2) can be made of the adhesive member of the same type as each other. For example, for the adhesive members, a solder, a silver paste or an insulation paste can be used. When the adhesive member of the same type is used, it is possible to simplify an assembly process of mounting the semiconductor chip CHP3, the high-side relay board RB1 and the low-side relay board RB2 on the chip mounting portion TAB. In this manner, the manufacturing cost of the semiconductor device SA1 can be reduced. However, the present embodiment is not limited to this, and the adhesive member which adheres the chip mounting portion TAB5 and the semiconductor chip CHP3 and the adhesive member which adheres the chip mounting portion TAB5 and the high-side relay board RB1 (low-side relay board RB2) can be also made of adhesive members of different types from each other. From a viewpoint of enhancing an effect of reducing the manufacturing cost of the semiconductor device SA1, note that the adhesive member which adheres the chip mounting portion TAB5 and the high-side relay board RB1 (low-side relay board RB2) can be also the adhesive member of the same type (a conductive adhesive member such as a solder or a silver paste) as the adhesive member which is used to adhere each IGBT chip and each diode chip. In this case, the assembly process can be further simplified.

(6) Further, without changing the lead frame, the present embodiment can support a change of connection to the different lead LD1, a change of the semiconductor chip CHP3, a change of each IGBT chip, and others by a change of a pattern of the wiring WL1 formed on the high-side relay board RB1 and a change of a pattern of the wiring WL2 formed on the low-side relay board RB2. That is, the present embodiment can flexibly support a design change of the semiconductor device SA1 by the changes of the patterns of the high-side relay board RB1 and the low-side relay board RB2. Thus, the semiconductor device SA1 according to the present embodiment is a useful technical idea in view of not only the improvement of the reliability and the performance but also provision of a technique of good versatility.

(7) Next, as the further features of the present embodiment as illustrated in FIG. 11, the high-side relay board RB1 and the low-side relay board RB2 are separately provided as the relay boards. For example, the high-side relay board RB1 is electrically connected with the leads LD1 whose numbers are 2 to number 4, and a high voltage of about 600 V is applied to these leads LD1 whose numbers are 2 to 4. Therefore, it is necessary to secure a breakdown voltage between a plurality of wiring WL1 formed on the high-side relay board RB1. In regard to this point, since the high-side relay board RB1 and the low-side relay board RB2 are separately provided in the present embodiment, the high-side relay board RB1 can be specifically designed from a viewpoint of sufficiently securing the breakdown voltage against the high voltage. Further, as illustrated in FIG. 11, each of the two IGBT chips (semiconductor chips CHP1 (HU) and CHP1 (HV)) which compose the high-side switching element is electrically connected with the high-side relay board RB1 by two wires of a gate wire (W2) and an emitter wire (W2). Therefore, the number of the wiring WL1 formed on the high-side relay board RB1 increases. Also from this viewpoint, in the present embodiment, the wiring pattern can be optimized for the high-side relay board RB1 since the high-side relay board RB1 and the low-side relay board RB2 are separately provided. That is, according to the present embodiment, the composition of the high-side relay board RB1 can be optimized by taking into account the breakdown voltage against the high voltage and the number of the wiring WL1.

Meanwhile, the low-side relay board RB2 is electrically connected with, for example, the lead LD1 to which a low voltage of about 15 V is applied. Therefore, the low-side relay board RB2 does not need to secure a larger breakdown voltage than that of the high-side relay board RB1. Further, as illustrated in FIG. 11, each of two IGBT chips (semiconductor chips CHP1 (LV) and CHP1 (LW)) which compose a low-side switching element is electrically connected with the low-side relay board RB2 via one gate wire (W2). Hence, the number of the wiring WL2 formed on the low-side relay board RB2 is smaller than the number of the wiring WL1 formed on the high-side relay board RB1. Thus, functions to be required in the high-side relay board RB1 and the low-side relay board RB2 are different from each other. Consequently, when the composition in which the high-side relay board RB1 and the low-side relay board RB2 are separately provided as in the present embodiment is employed, each of the high-side relay board RB1 and the low-side relay board RB2 can be optimized. For example, the low-side relay board RB2 can be downsized as results of no requirement of securing the insulated distance between the wires and the less number of wires compared to the high-side relay board RB1.

(8) Further, according to the present embodiment, based on the assumption that the high-side relay board RB1 and the low-side relay board RB2 are separately provided, the high-side relay board RB1 and the low-side relay board RB2 are arranged so as to sandwich the semiconductor chip CHP3 as illustrated in FIG. 11. The reason is as follows. That is, in FIG. 11, the three IGBT chips (semiconductor chips CHP1 (HU), CHP1 (HV) and CHP1 (HW)) which compose the high-side switching element are arranged in the right region of the virtual line VL, and the three IGBT chips (semiconductor chips CHP1 (LU), CHP1 (LV) and CHP1 (LW)) which compose the low-side switching element are arranged in the left region of the virtual line VL.

In the consideration of the shortening of the lengths of the wires (W1 and W2) based on this composition, it is desirable to, for example, arrange the high-side relay board RB1 and the low-side relay board RB2 on both sides of the semiconductor chip CHP3 illustrated in FIG. 11. This is because a composition of arranging the semiconductor chip CHP3 on the virtual line VL, arranging the high-side relay board RB1 in the right region of the virtual line VL and arranging the low-side relay board RB2 in the left region of the virtual line VL can be considered to be the most natural arrangement which can shorten the lengths of the wires (W1 and W2) while securing control performance of the semiconductor chip CHP3 for the six IGBT chips.

Further, according to the present embodiment, based on the assumption that the composition in which the high-side relay board RB1 and the low-side relay board RB2 are arranged so as to sandwich the semiconductor chip CHP3, a layout arrangement in the semiconductor chip CHP3 is also particularly devised in order to shorten the wires W1 which connect the semiconductor chip CHP3 and the high-side relay board RB1. That is, as illustrated in FIG. 11, three "floating island structures" connected with the high-side relay board RB1 are arranged along the side of the semiconductor chip CHP3 on the side of the high-side relay board RB1. Consequently, according to the present embodiment, as illustrated in FIG. 11, it is possible to shorten the distance between the three "floating island structures" in the semiconductor chip CHP3 and the high-side relay board RB1, so that the lengths of the wires W1 which connect the "floating island structures" and the high-side relay board RB1 can be shortened.

(9) According to the present embodiment, the high-side relay board RB1 and the low-side relay board RB2 are separately provided from each other. At this time, when the functions of the respective relay boards (the high-side relay board RB1 and the low-side relay board RB2) are optimized, the planar size and the wiring pattern of the high-side relay board RB1 and the planar size and the wiring pattern of the low-side relay board RB2 are different from each other. However, the technical idea of the present embodiment is not limited to this, and the planar size and the wiring pattern of the high-side relay board RB1 and the planar size and the wiring pattern of the low-side relay board RB2 can also be made common. In this case, for example, unnecessary wire is also formed on the low-side relay board RB2. However, by the common between the high-side relay board RB1 and the low-side relay board RB2 common, an effect of reducing the manufacturing cost can be obtained.

<Method of Manufacturing Semiconductor Device According to Embodiment>

The semiconductor device according to the present embodiment is composed as described above, and a method of manufacturing this semiconductor device will be described below with reference to the drawings.

First, the manufacturing processes of the semiconductor device according to the present embodiment will be briefly described with reference to a flowchart, and then, will be described in detail with reference to the drawing corresponding to each process.

Figure 13:
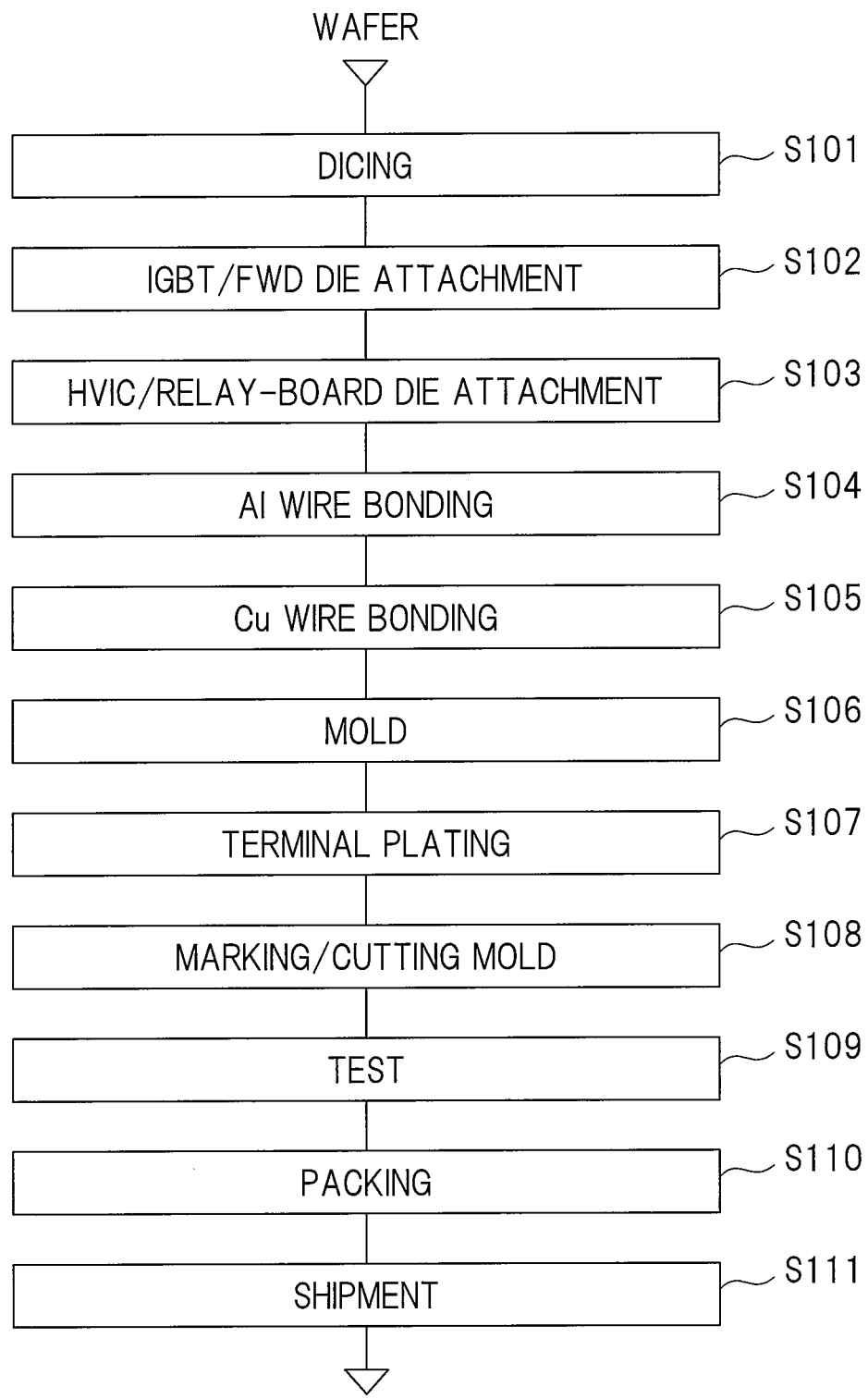
FIG. 13 is a flowchart illustrating a flow of a semiconductor device manufacturing process according to the embodiment.

FIG. 13 is a flowchart illustrating a flow of the manufacturing processes of the semiconductor device according to the present embodiment. In FIG. 13, a wafer on which an integrated circuit is formed is prepared, and this wafer is diced, so that chip regions formed on the wafer are singulated, and a plurality of semiconductor chips are obtained from the wafer (S101).

Next, the lead frame (L/F) including a plurality of chip mounting portions and a plurality of leads is prepared. Further, the IGBT chips and the diode chips are mounted on a plurality of chip mounting portions formed on this lead frame (IGBT/FWD die attach) S102). Subsequently, the control chips (HVIC) and the relay boards are mounted on the other chip mounting portions (HVIC/relay board die attach) (S103).

Subsequently, each IGBT chip, each diode chip and each lead are electrically connected via the aluminum wires (Al wires) (Al wire bonding) (S104). Subsequently, each control chip and each lead, each control chip and each IGBT chip, each control chip and each relay board, and each relay board and each IGBT chip are electrically connected via copper wires (Cu wires) (Cu wire bonding) (S105).

Further, a part of each IGBT chip, each diode chip, each control chip, each relay board, each aluminum wire, each copper wire and each lead are sealed by the sealing body (S106). Next, a plated film is formed on the surface of each lead exposed from the sealing body (S107). Subsequently, a mark is formed on the top surface of the sealing body, and then, the lead frame is cut to mold each lead exposed from the sealing body, so that the semiconductor device is obtained (S108). Subsequently, a test process such as an electrical characteristics test and an external appearance test is conducted on this semiconductor device (S109), and then, each semiconductor device which has been determined as a good product in the test process is packed (S110) and each packed semiconductor device is shipped (S111). As described above, it is possible to manufacture the semiconductor device according to the present embodiment.

The manufacturing processes of the semiconductor device according to the present embodiment will be more specifically described below with reference to the drawings.

1. Preparing Process of Lead Frame

Figure 14:
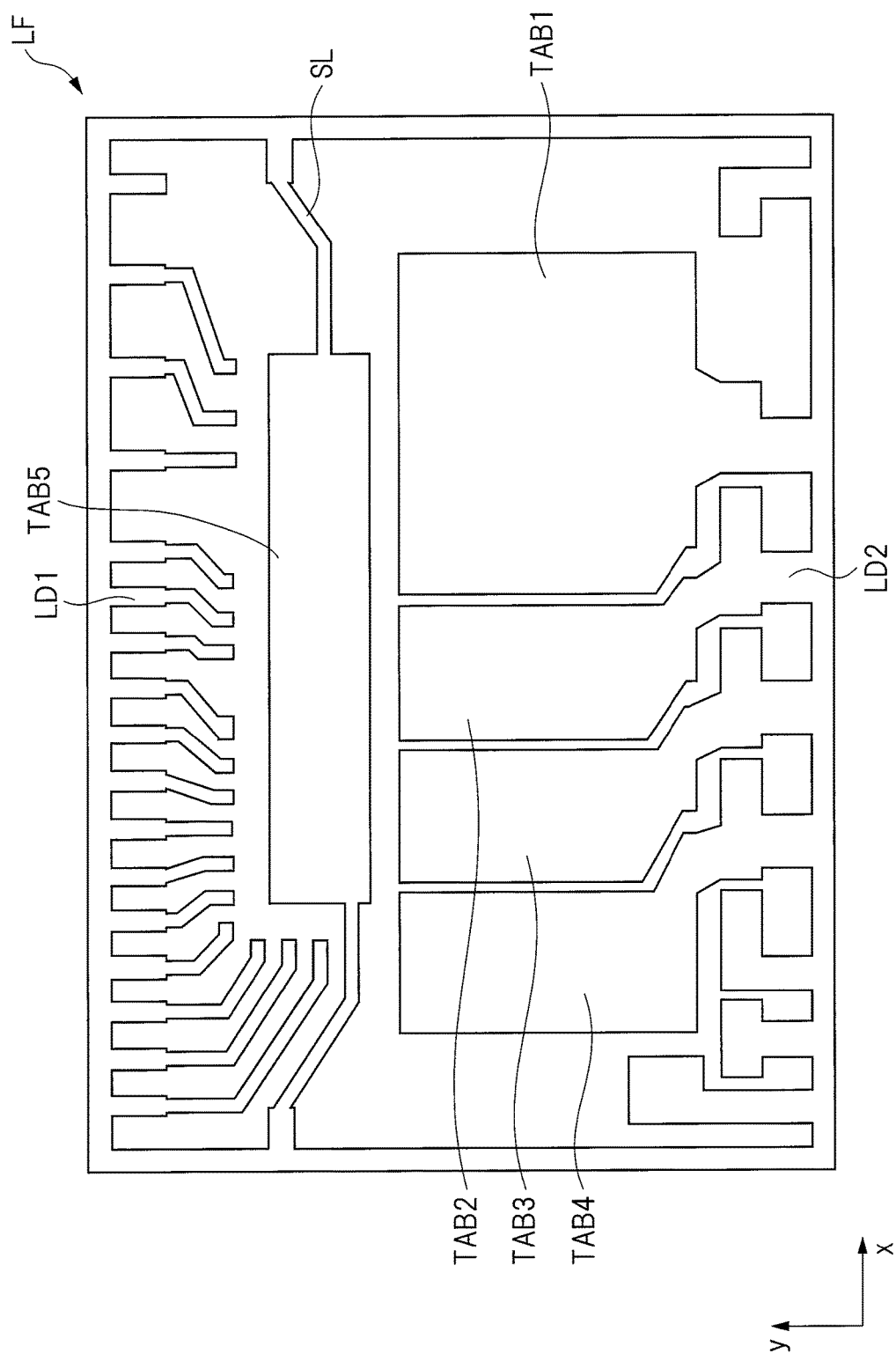
FIG. 14 is a plan view illustrating the semiconductor device manufacturing process according to the embodiment.

First, as illustrated in FIG. 14, a lead frame LF formed by, for example, a copper material is prepared. This lead frame LF is provided with the chip mounting portions TAB1 to TAB5, a plurality of leads LD1, a plurality of leads LD2 and the support lead SL. At this time, a part of a plurality of leads LD2 and each of the chip mounting portions TAB1 to TAB4 are integrally formed, and a plurality of leads LD2 are connected with a frame body of the lead frame LF. Further, a plurality of leads LD1 are also connected with the frame body of the lead frame LF. Furthermore, the support lead SL supports the chip mounting portion TAB5. The chip mounting portions TAB1 to TAB4 are arranged along the x direction. In other words, it can be said that the chip mounting portions TAB1 to TAB4 are arranged along a direction in which a plurality of leads LD2 are aligned. Further, the chip mounting portion TAB5 is arranged between a plurality of leads LD1 and at least the x-direction-aligned chip mounting portions TAB1 to TAB3.

2. Die Bonding Process

Figure 15:
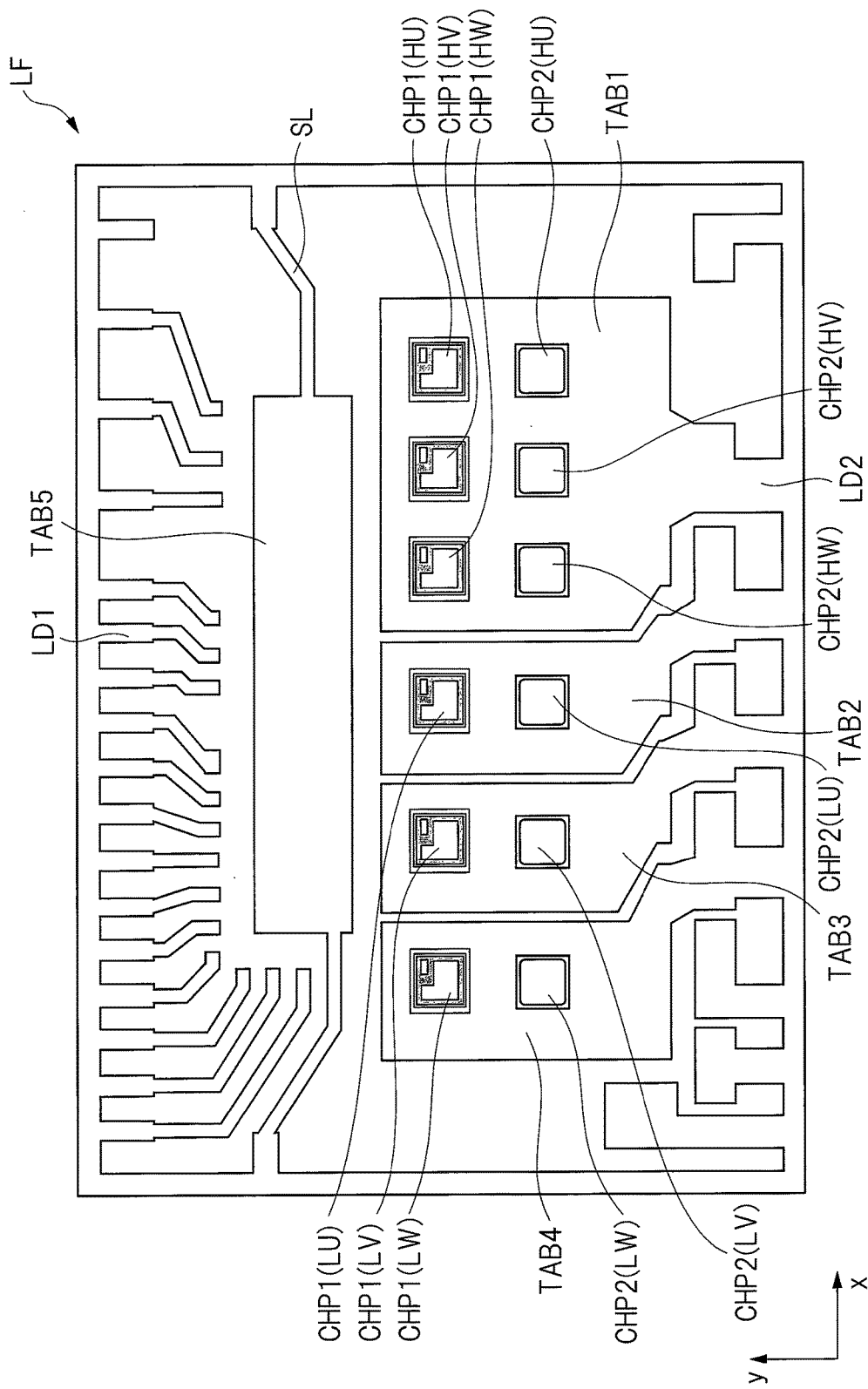
FIG. 15 is a plan view illustrating the semiconductor device manufacturing process continued from FIG. 14.

Subsequently, as illustrated in FIG. 15, the semiconductor chip CHP1 (HU), the semiconductor chip CHP1 (HV) and the semiconductor chip CHP1 (HW) having the IGBTs functioning as the high-side switching elements (the U phase, the V phase and the W phase) of the inverter are mounted on the chip mounting portion TAB1 via, for example, a conductive adhesive member (a high melting point solder or silver paste whose melting point is about 300° C.). Similarly, the semiconductor chip CHP2 (HU), the semiconductor chip CHP2 (HV) and the semiconductor chip CHP2 (HW) having the diodes are mounted on the chip mounting portion TAB1 via the conductive adhesive member. Further, on the chip mounting portion TAB2, the semiconductor chip CHP1 (LU) on which the IGBT functioning as the low-side switching element (U phase) of the inverter is mounted, and the semiconductor chip CHP2 (LU) on which the diode is formed is mounted via the conductive adhesive member. Similarly, on the chip mounting portion TAB3, the semiconductor chip CHP1 (LV) on which the IGBT functioning as the low-side switching element (V phase) of the inverter is mounted, and the semiconductor chip CHP2 (LV) on which the diode is formed is mounted via the conductive adhesive member. Further, on the chip mounting portion TAB4, the semiconductor chip CHP1 (LW) on which the IGBT functioning as the low-side switching element (W phase) of the inverter is mounted, and the semiconductor chip CHP2 (LW) on which the diode is formed is mounted via the conductive adhesive member.

Figure 16:
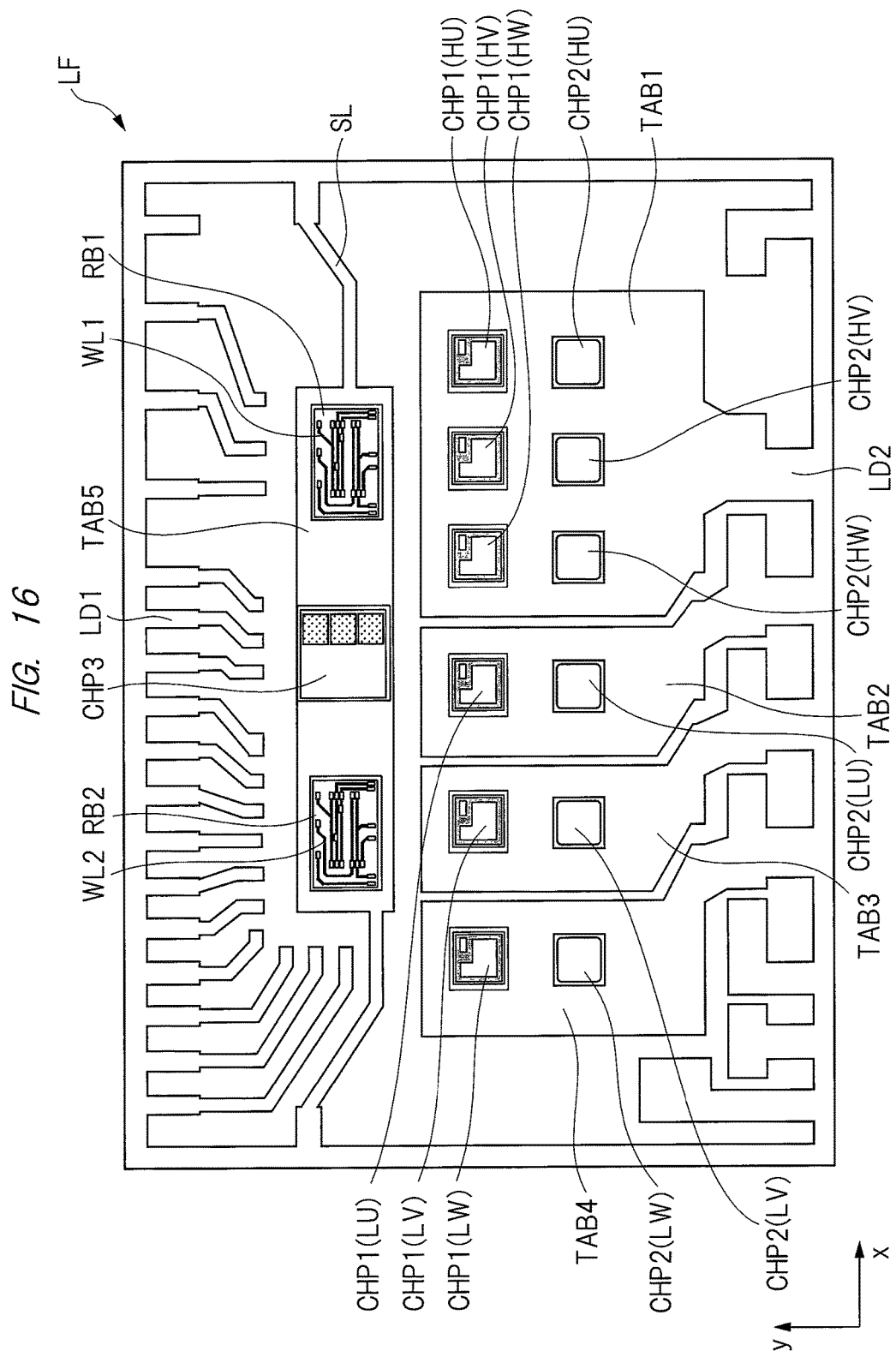
FIG. 16 is a plan view illustrating the semiconductor device manufacturing process continued from FIG. 15.

Subsequently, as illustrated in FIG. 16, on the chip mounting portion TAB5, the semiconductor chip CHP3 which is the control chip on which the gate control circuit is formed is mounted via the conductive adhesive member. Further, on the chip mounting portion TAB5, the high-side relay board RB1 and the low-side relay board RB2 are also mounted via the conductive adhesive member. At this time, as illustrated in FIG. 16, the semiconductor chip CHP3 is arranged so as to be sandwiched by the high-side relay board RB1 and the low-side relay board RB2. According to the present embodiment, a plurality of wiring WL1 are formed on the high-side relay board RB1, and a plurality of wiring WL2 are formed on the low-side relay board RB2. Here, as illustrated in, for example, FIG. 16, the pattern of a plurality of wiring WL1 formed on the high-side relay board RB1 and a pattern of a plurality of wiring WL2 formed on the low-side relay board RB2 can be made the same pattern. That is, it is possible to use relay boards including a common wiring pattern as the high-side relay board RB1 and the low-side relay board RB2. In this case, it is not required to prepare individual relay boards for the high-side relay board RB1 and the low-side relay board RB2, and therefore, the manufacturing cost can be reduced. That is, by the common in the components between the high-side relay board RB1 and the low-side relay board RB2, the manufacturing cost of the semiconductor device can be reduced.

Further, according to the present embodiment, the conductive adhesive member which adheres the chip mounting portions TAB1 to TAB4 and each IGBT chip (each diode chip), the conductive adhesive member which adheres the chip mounting portion TAB5 and the semiconductor chip CHP3, and the conductive adhesive member which adheres the chip mounting portion TAB5 and the relay boards (the high-side relay board RB1 and the low-side relay board RB2) are made common. Consequently, according to the present embodiment, the die bonding process can be simplified, so that the manufacturing cost of the semiconductor device can be reduced.

3. Wire Bonding Process

Figure 17:
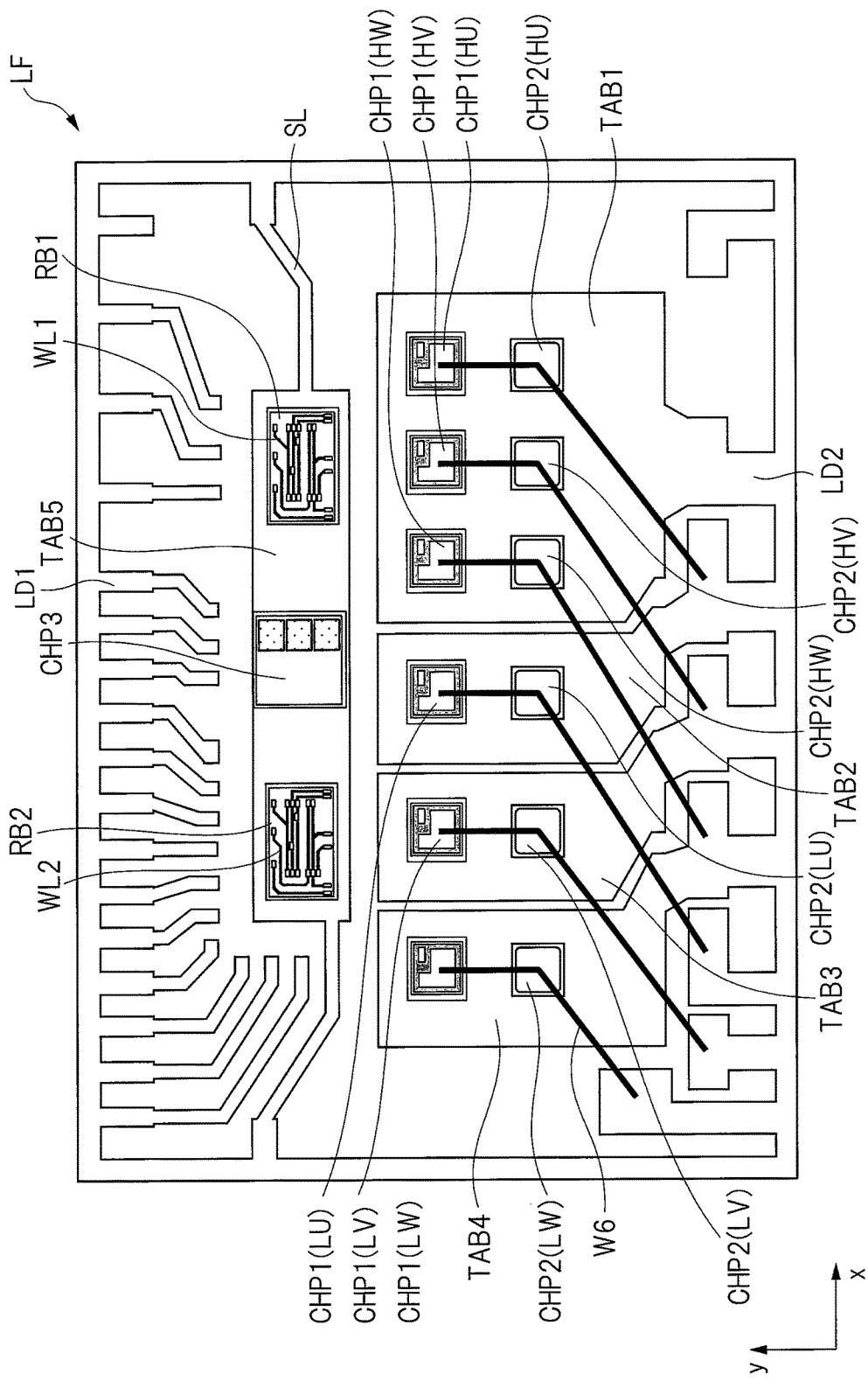
FIG. 17 is a plan view illustrating the semiconductor device manufacturing process continued from FIG. 16.

Next, as illustrated in FIG. 17, the IGBT chip, the diode chip and the lead LD2 are electrically connected via the wires W6 formed of, for example, the aluminum wires. More specifically, the emitter electrode pad of the semiconductor chip CHP1 (HU), the anode electrode pad of the semiconductor chip CHP2 (HU) and one lead LD2 are electrically connected via the wires W6. Similarly, the emitter electrode pad of the semiconductor chip CHP1 (HV), the anode electrode pad of the semiconductor chip CHP2 (HV) and one lead LD2 are electrically connected via the wires W6. Further, the emitter electrode pad of the semiconductor chip CHP1 (HW), the anode electrode pad of the semiconductor chip CHP2 (HW) and one lead LD2 are electrically connected via the wires W6. Furthermore, the emitter electrode pad of the semiconductor chip CHP1 (LU), the anode electrode pad of the semiconductor chip CHP2 (LU) and one lead LD2 are electrically connected via the wires W6. Similarly, the emitter electrode pad of the semiconductor chip CHP1 (LV), the anode electrode pad of the semiconductor chip CHP2 (LV) and one lead LD2 are electrically connected via the wires W6. Further, the emitter electrode pad of the semiconductor chip CHP1 (LW), the anode electrode pad of the semiconductor chip CHP2 (LW) and one lead LD2 are electrically connected via the wires W6.

Figure 18:
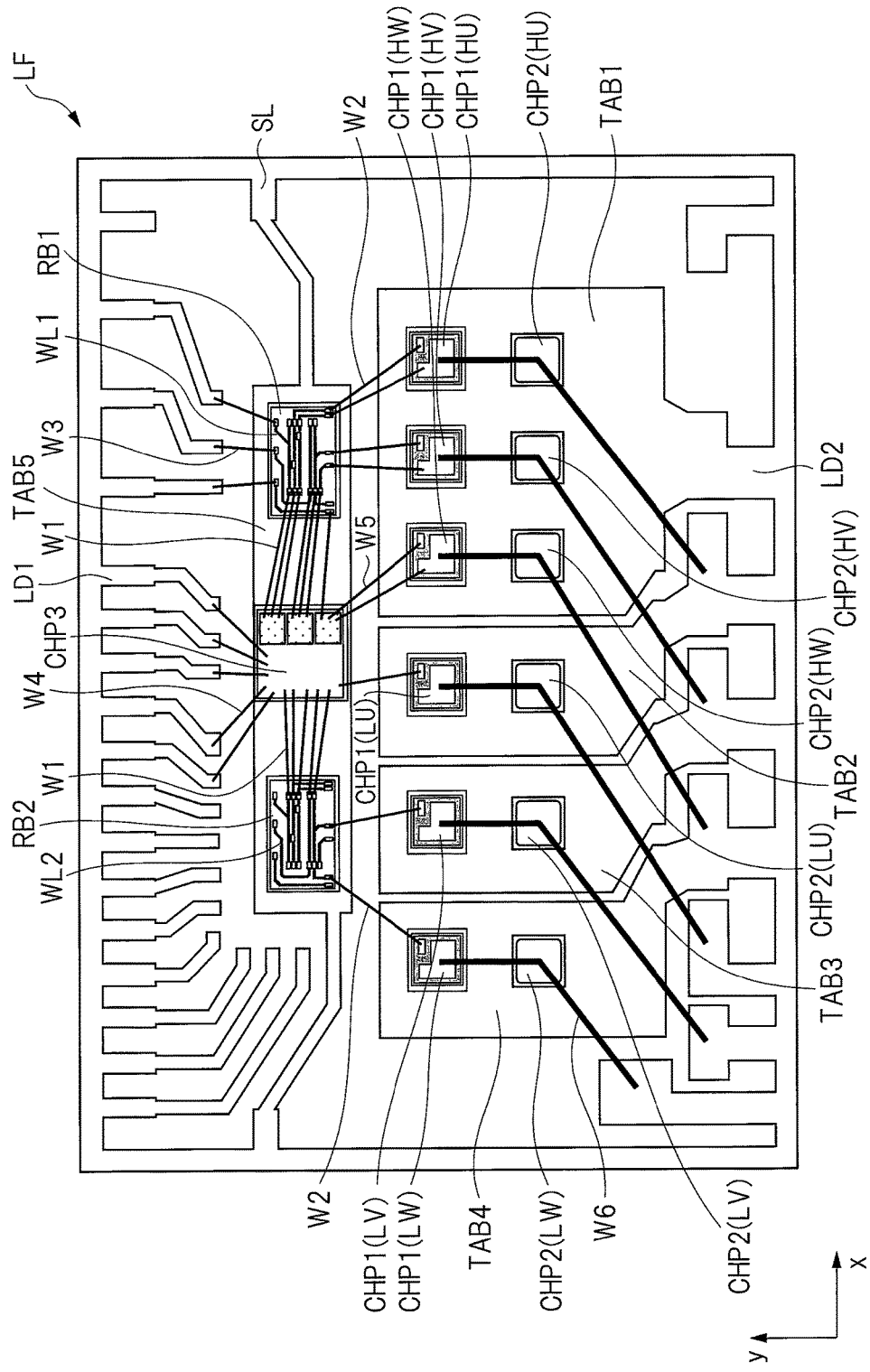
FIG. 18 is a plan view illustrating the semiconductor device manufacturing process continued from FIG. 17.

Subsequently, as illustrated in FIG. 18, the semiconductor chip CHP3 and the high-side relay board RB1 are electrically connected via a plurality of wires W1 formed of the gold wires or the copper wires, and the semiconductor chip CHP3 and the low-side relay board RB2 are electrically connected via a plurality of wires W1.

Further, the high-side relay board RB1 and the semiconductor chip CHP1 (HU) are electrically connected via the two wires W2 (the gate wire and the emitter wire), and the high-side relay board RB1 and the semiconductor chip CHP1 (HV) are electrically connected via the two wires W2 (the gate wire+the emitter wire).

Furthermore, the semiconductor chip CHP3 and the semiconductor chip CHP1 (HW) are electrically connected via the two wires W5 (the gate wire+the emitter wire).

Still further, the semiconductor chip CHP3 and the semiconductor chip CHP1 (LU) are electrically connected via one wire W5. Besides, the low-side relay board RB2 and the semiconductor chip CHP1 (LV) are electrically connected via one wire W2 (gate wire), and the low-side relay board RB2 and the semiconductor chip CHP1 (LW) are electrically connected via one wire W2 (gate wire).

Moreover, the semiconductor chip CHP3 and a part of a plurality of leads LD1 are electrically connected via a plurality of wires W4, and the high-side relay board RB1 and a part of a plurality of leads LD1 are electrically connected via a plurality of wires W3.

Thus, the wire bonding process in the present embodiment is performed. According to the wire bonding process in the present embodiment, occurrence of an increase in wire lengths of the wires W1 to W5 can be suppressed by using the high-side relay board RB1 and the low-side relay board RB2. That is, in the wire bonding process in the present embodiment, the occurrence of the increase in the wire lengths is suppressed by replacing the connection between the components whose wire lengths are increased by the connection via one wire with such connection via the plurality of wires as interposing the high-side relay board RB1 and the low-side relay board RB2. That is, according to the present embodiment, all wire lengths of the wires W1 to W5 can be shortened.

4. Molding Process (Sealing Process)

Figure 19:
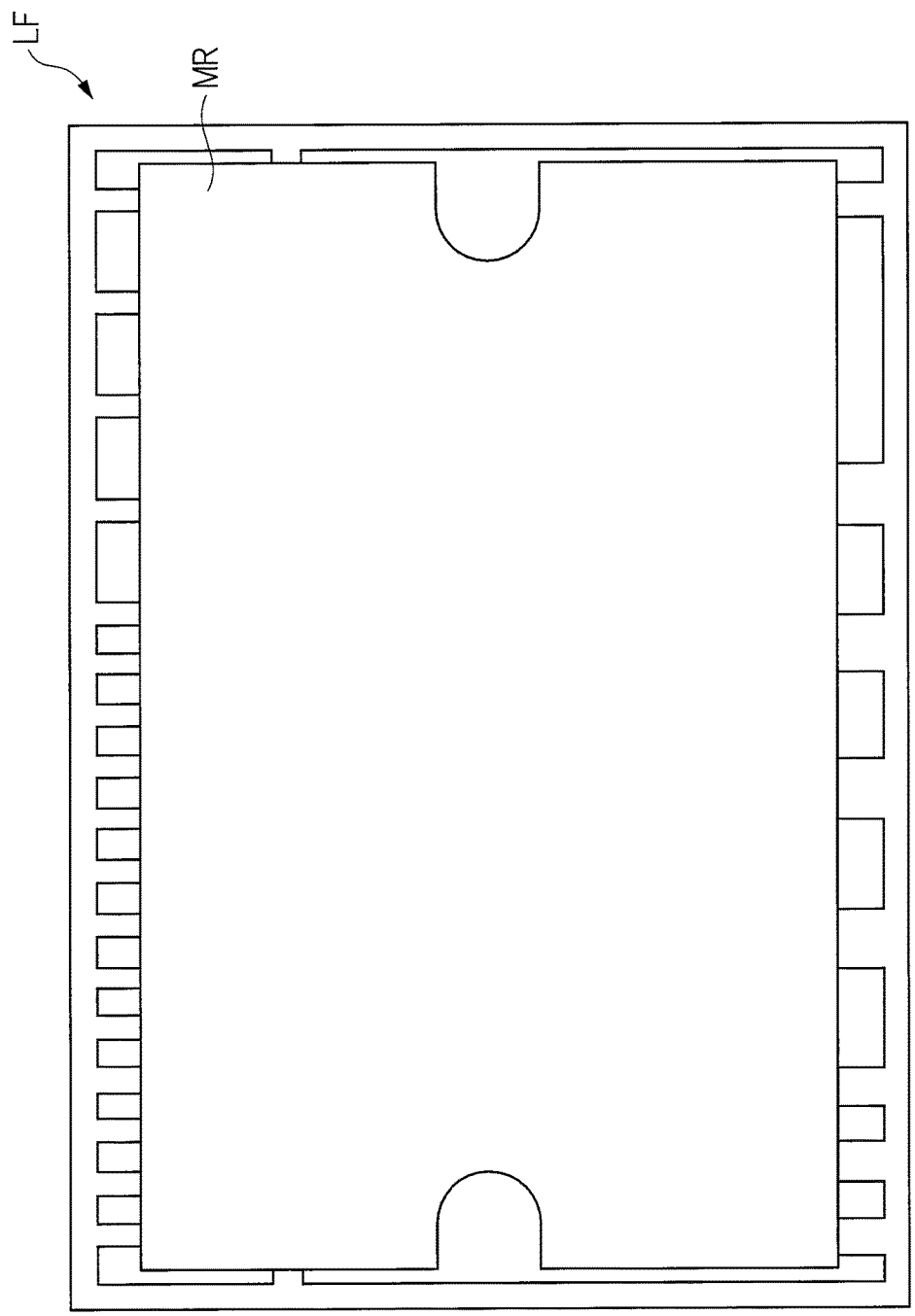
FIG. 19 is a plan view illustrating the semiconductor device manufacturing process continued from FIG. 18.

Next, as illustrated in FIG. 19, the semiconductor chips CHP1 (HU), CHP1 (HV) and CHP1 (HW), the semiconductor chips CHP1 (LU), CHP1 (LV) and CHP1 (LW), the semiconductor chips CHP2 (HU), CHP2 (HV) and CHP2 (HW), and the semiconductor chips CHP2 (LU), CHP2 (LV) and CHP2 (LW) are sealed by the sealing body MR made of resin. Here, by the sealing body MR, the chip mounting portions TAB1 to TAB5, the wires W1 to W6, a part of each of a plurality of leads LD1 and a part of each of a plurality of leads LD2 are also sealed.

The resin injection pressure in a molding process is applied to the wires W1 to W6. However, in the present embodiment, the wire lengths of the wires W1 to W6 become short. Therefore, a wire flow caused by the resin injection pressure hardly occurs, and a short-circuit fault between the adjacent wires can be suppressed. As a result, according to the method of manufacturing the semiconductor device according to the present embodiment, the reliability of the semiconductor device can be improved, and besides, a manufacturing yield of the semiconductor device can be improved.

5. External Plating Process

Figure 20:
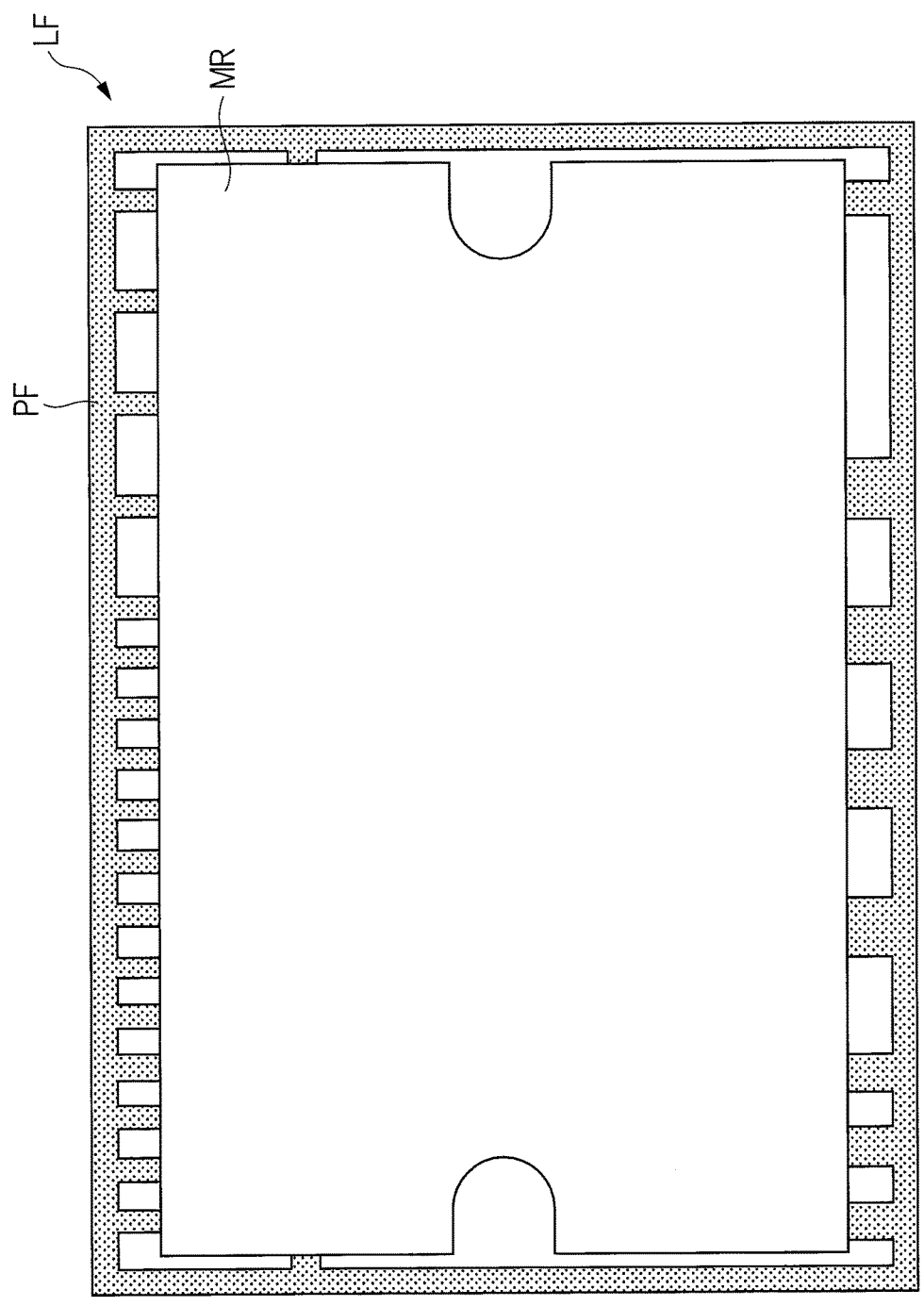
FIG. 20 is a plan view illustrating the semiconductor device manufacturing process continued from FIG. 19.

Subsequently, although not illustrated, a tie-bar provided to the lead frame LF is cut. Further, as illustrated in FIG. 20, a plated film PF which is a conductor film is formed on the surface of a part of each of a plurality of leads LD1 exposed from the sealing body MR, and the surface of a part of each of a plurality of leads LD2.

6. Marking Process

Figure 21:
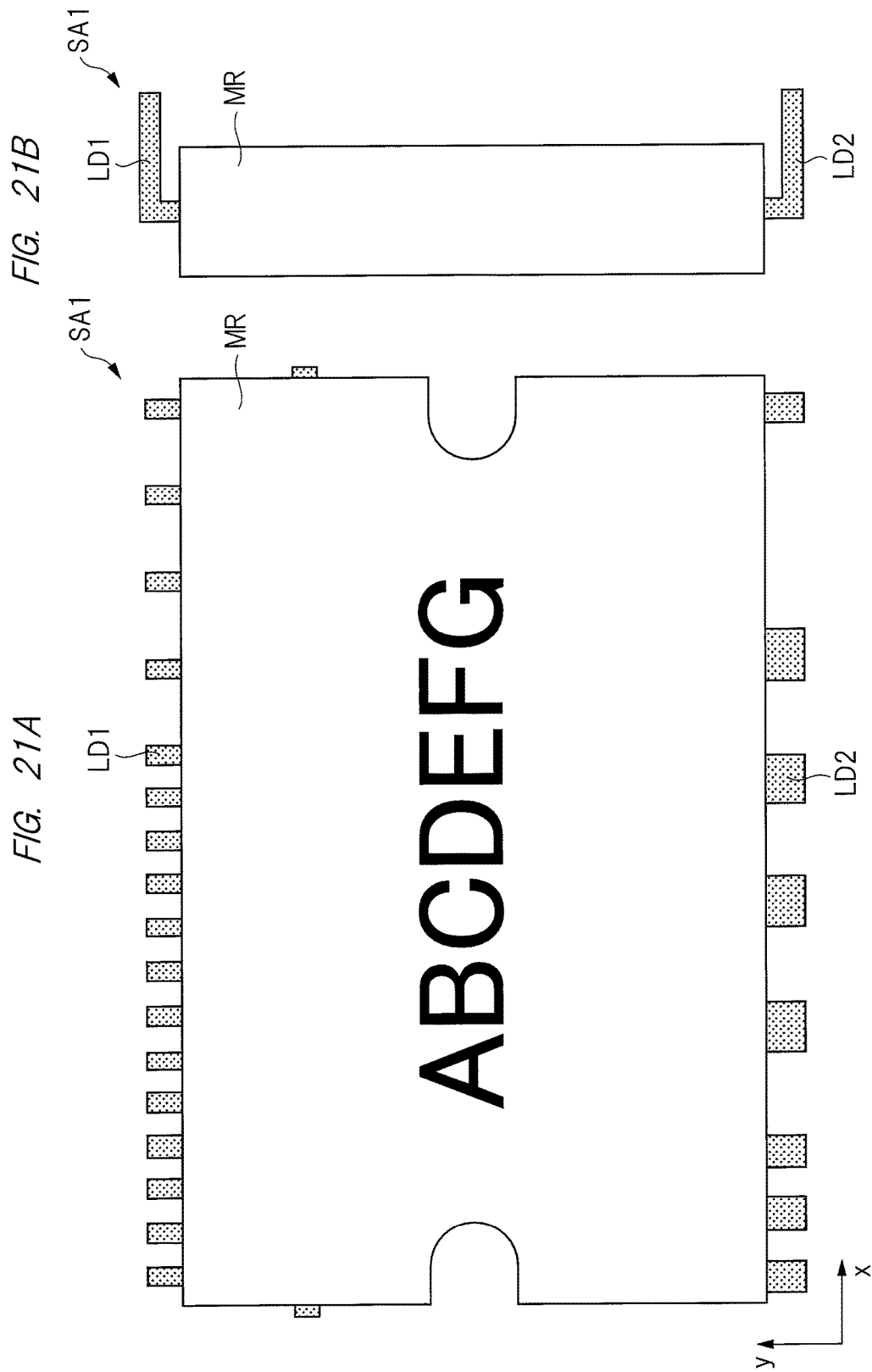
FIG. 21A is a plan view illustrating the semiconductor device manufacturing process continuing from FIG. 20.
FIG. 21B is a side view thereof.

Next, as illustrated in FIG. 21A, information (mark) such as a product name or a model number is formed on the surface of the sealing body MR made of resin. Note that a stamping method by a printing method or an engraving method by irradiating the surface of the sealing body with laser beams can be used for a mark forming method.

7. Singulating Process+Lead Molding Process

Subsequently, after the lead LD1 and the lead LD2 are cut, the lead LD1 and the leads LD2 are bent as illustrated in FIG. 21B to mold the lead LD1 and the leads LD2.

Further, for example, a test process such as an electrical characteristics test and an external appearance test is performed, and then, a semiconductor device which is determined as a good product in the test process is packed and is shipped. As described above, the semiconductor device according to the present embodiment can be manufactured.

Modified Example

In the foregoing, the invention made by the present inventors has been concretely described based on the embodiments. However, it is needless to say that the present invention is not limited to the foregoing embodiments and various modifications and alterations can be made within the scope of the present invention.

Modified Example 1

Figure 22:
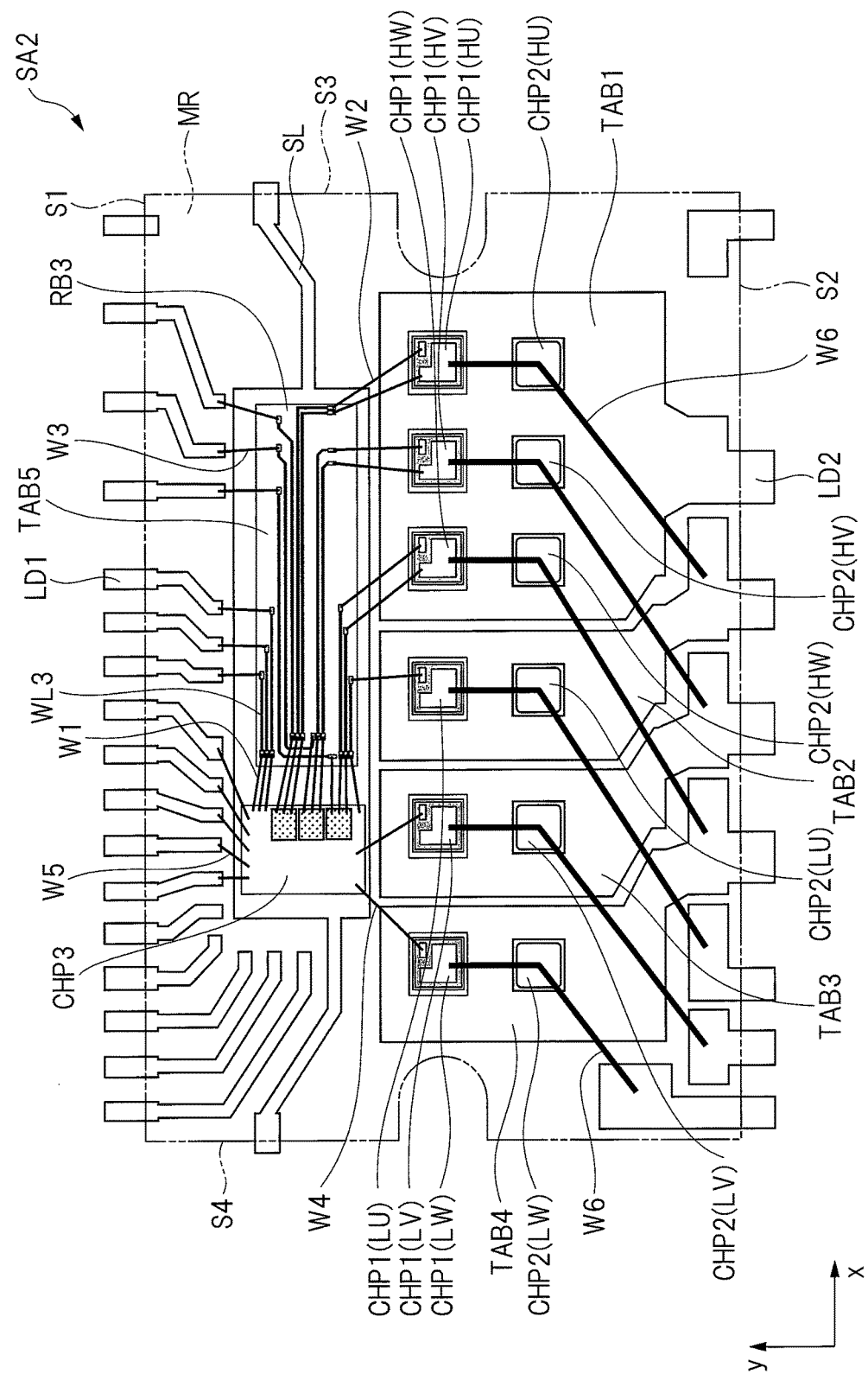
FIG. 22 is a plan view illustrating a mounting composition of a semiconductor device according to a first modification example.

FIG. 22 is a plan view illustrating a planar composition of a semiconductor device SA2 according to modified example 1 of the embodiment. A difference in a composition between the semiconductor device SA2 according to the present modified example 1 illustrated in FIG. 22 and the semiconductor device SA1 according to the embodiment illustrated in FIG. 11 is as follows. That is, in the semiconductor device SA1 according to the embodiment illustrated in FIG. 11, a high-side relay board RB1 and a low-side relay board RB2 are arranged on a back surface of a chip mounting portion TAB5 so as to sandwich a semiconductor chip CHP3. On the other hand, in the semiconductor device SA2 according to the present modified example 1 illustrated in FIG. 22, the semiconductor chip CHP3 is arranged so as to be shifted to the left of the chip mounting portion TAB5, and one relay board RB3 is arranged on the right of this semiconductor chip CHP3. Further, this relay board RB3 includes a plurality of wiring WL3, is electrically connected via wires W1 with a "floating island structure" which is a high breakdown voltage portion of the semiconductor chip CHP3, and is electrically connected with a low breakdown voltage portion of the semiconductor chip CHP3 via the wires W1 as well. Furthermore, the relay board RB3 in the present modified example 1 is electrically connected via wires W2 with semiconductor chips CHP1 (HU), CHP1 (HV) and CHP1 (HW) on which IGBT composing a high-side switching element of an inverter is formed, and is electrically connected via the wires W2 with a semiconductor chip CHP1 (LU) on which an IGBT composing a low-side switching element of the inverter is formed as well. Meanwhile, also in the present modified example 1, the relay board RB3 is electrically connected with a part of a plurality of leads LD1 via wires W3.

Also in the semiconductor device SA2 according to the present modified example 1 composed as described above, the occurrence of the increase in wire lengths can be suppressed by replacing the connection between the components whose wire lengths are increased by the connection via one wire with such connection via a plurality of wires as interposing the relay board RB3. Therefore, the semiconductor device SA2 according to the present modified example 1 can also obtain a substantially same effect as that of the semiconductor device SA1 according to the above-described embodiment.

However, in the relay board RB3 according to the present modified example 1, the high-side relay board RB1 and the low-side relay board RB2 are not separated from each other as different from the relay board in the above-described embodiment. Therefore, from a viewpoint of optimizing a breakdown voltage resistance and the number of wires by a dedicated design suitable for the high-side and low-side, the semiconductor device SA1 according to the above-described embodiment is desirable. Meanwhile, when the high-side relay board RB1 and the low-side relay board RB2 are separated, it is difficult to make the relay boards common without providing unnecessary dummy wires. In regard to this point, only one type of the relay board is used according to the relay board RB3 according to the present modified example 1, and therefore, it is possible to make the relay boards common without providing unnecessary dummy wires.

Modified Example 2

Figure 23:
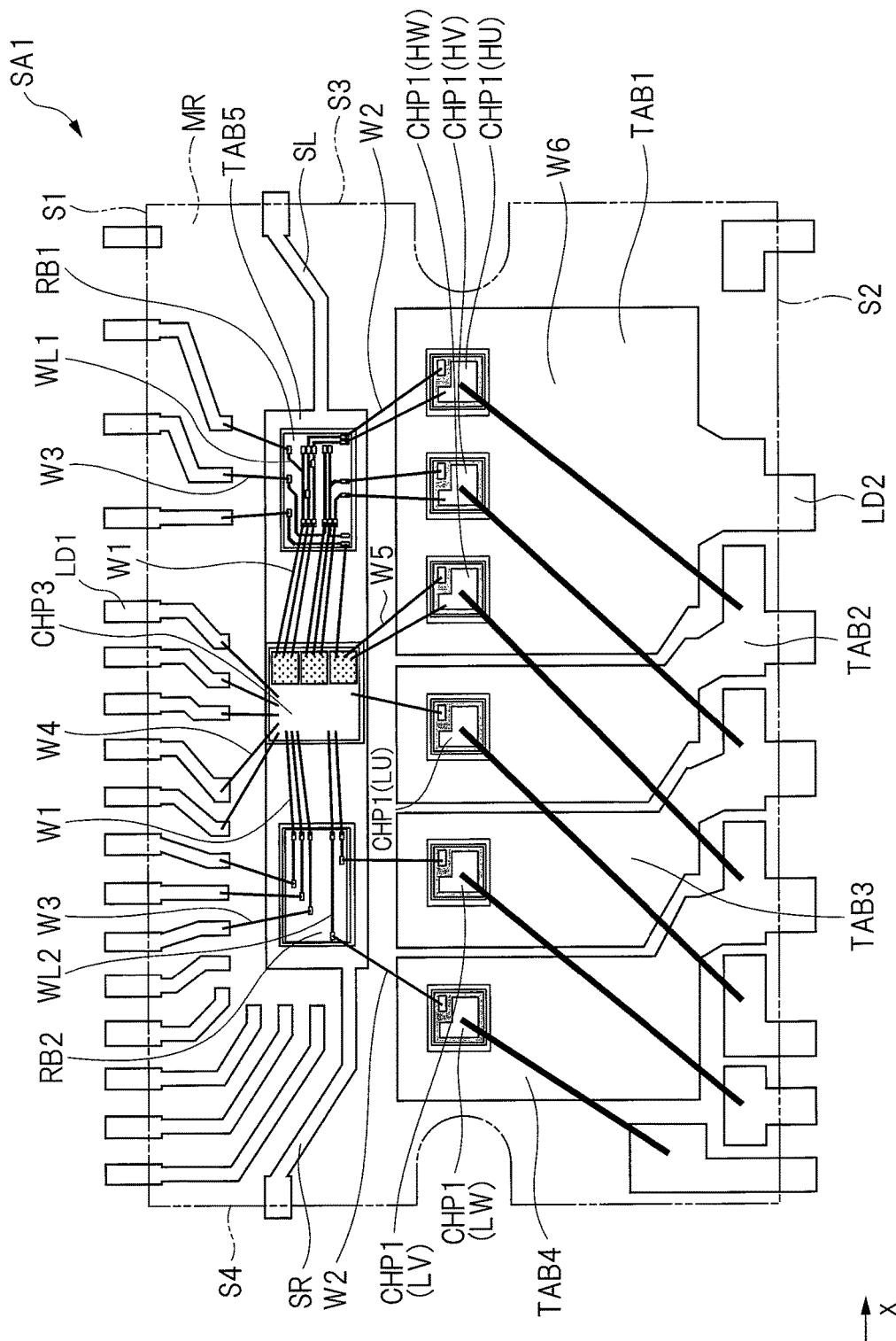
FIG. 23 is a plan view illustrating a mounting composition of a semiconductor device according to a second modification example.

In the above-described embodiment, an example of usage of the IGBT as the "power transistor" has been described. However, the technical idea of the above-described embodiment is not limited to this, and is also applicable to, for example, a composition in which the power MOSFET is used as the "power transistor". A body diode which is a parasitic diode is naturally formed on each power MOSFET, and this body diode functions as a freewheeling diode. Therefore, as illustrated in, for example, FIG. 23, it is not required to provide the diode.

Modified Example 3

In the above-described embodiment, for example, a DIP (Dual Inline package) has been exemplified as a package structure of a semiconductor device. However, the technical idea of the above-described embodiment is not limited to this, and is also applicable to package structures such as a SOP (Small Outline Package) and a SON (Small Outline Non-Leaded Package).

Modified Example 4

In the above-described embodiment, a substrate including a wire has been exemplified as a relay board. However, the technical idea of the above-described embodiment is not limited to this, and the same material as that of a lead frame described in the above-described embodiment is also applicable to the relay board. However, when the lead frame is used for the relay board, on a chip mounting portion TAB5, it is preferable to mount a relay board formed of the lead frame via an insulating adhesive member (insulation paste) so as to prevent conduction with the chip mounting portion TAB5.

Modified Example 5

A semiconductor device according to the above-described embodiment is formed by an electronic component which achieves an inverter. However, the semiconductor device may further include an electronic component which achieves an additional function.

Modified Example 6

In the above-described embodiment, an example of the arrangement of the high-side relay board RB1 as illustrated in, for example, FIG. 11, has been described, the high-side relay board RB1 being arranged on a virtual line VL2 along a "y" direction passing through a second IGBT chip (semiconductor chip CHP1 (HV)) counted from the right among the six IGBT chips arranged along a long side (a side S2 extending along an x direction illustrated in FIG. 11) of a sealing body MR. However, the technical idea of the above-described embodiment is not limited to this, and the high-side relay board RB1 may be arranged on a virtual line along the y direction passing between a first IGBT chip (semiconductor chip CHP1 (HU)) counted from the right and a second IGBT chip (semiconductor chip CHP1 (HV)) counted from the right among the six IGBT chips.

Similarly, in the above-described embodiment, an example of the arrangement of the low-side relay board RB2 as illustrated in, for example, FIG. 11, has been described, the low-side relay board RB2 being arranged on a virtual line VL3 along the y direction passing through a second IGBT chip (semiconductor chip CHP1 (HV)) counted from the left among the six IGBT chips arranged along a long side (a side S2 extending along an x direction illustrated in FIG. 11) of a sealing body MR. However, the technical idea of the above-described embodiment is not limited to this, and the low-side relay board RB2 may be arranged on a virtual line along the y direction passing between a first IGBT chip (semiconductor chip CHP1 (LW)) counted from the left and a second IGBT chip (semiconductor chip CHP1 (LV)) counted from the left among the six IGBT chips.

Modified Example 7

In the above-described embodiment, as illustrated in, for example, FIG. 11, a composition example in which a semiconductor chip CHP1 (HV) and a semiconductor chip CHP3 are electrically connected via wires W1, a high-side relay board RB1 and wires W2 has been described in the embodiment. However, when an appearance shape size of the semiconductor chip CHP3 is large, and besides, when a distance between the semiconductor chip CHP1 (HV) and the semiconductor chip CHP3 is small, the semiconductor chip CHP1 (HV) and the semiconductor chip CHP3 may be electrically connected directly via wires W5.

Similarly, in the above-described embodiment, as illustrated in, for example, FIG. 11, a composition example in which a semiconductor chip CHP1 (LV) and a semiconductor chip CHP3 are electrically connected via wires W1, a low-side relay board RB2 and wires W2 has been described in the embodiment. However, when an appearance shape size of the semiconductor chip CHP3 is large, and besides, when a distance between the semiconductor chip CHP1 (LV) and the semiconductor chip CHP3 is small, the semiconductor chip CHP1 (LV) and the semiconductor chip CHP3 may be electrically connected directly via wires W5.

Modified Example 8

Modified examples can also be combined within the scope of the concept of the technical idea described in the above-described embodiment.

The above-described embodiment includes the following aspects.

(Additional Note 1)

A method of manufacturing a semiconductor device includes the following steps of: (a) a step of preparing a lead frame including a first lead group arranged along a first direction in plan view, a second lead group arranged along the first direction so as to be distant from the first lead group, a first component mounting portion arranged between the first lead group and the second lead group, and a plurality of second component mounting portions arranged between the first lead group and the second lead group and are arranged between the first component mounting portion and the second lead group, (b) a step of mounting a plurality of second electronic components on the plurality of second component mounting portions along the first direction, (c) a step of mounting a first electronic component and a substrate on the first component mounting portion, the substrate being arranged adjacent to the first electronic component in plan view, (d) a step of electrically connecting the second electronic component and a part of the second lead group, (e) a step of electrically connecting the first component and a part of the first lead group, and electrically connecting the first electronic component and each of the plurality of second electronic components; and (f) a step of sealing the first electronic component, the substrate and the second electronic components by a sealing body. Here, the step of (e) includes a step of electrically connecting the first electronic component and a part of the plurality of second electronic components via a first wire which couples the first electronic component and the substrate, the substrate, and the second wire which electrically connects the substrate and the part of the second electronic components.

What is claimed is:

1. A semiconductor device comprising:
a sealing body comprised of a quadrangle in plan view;
a first lead group arranged along a first side of the sealing body in plan view;
a second lead group arranged along a second side of the sealing body facing the first side in plan view;
a first component mounting portion arranged between the first lead group and the second lead group in plan view;
a plurality of second component mounting portions arranged between the first lead group and the second lead group, and arranged between the first component mounting portion and the second lead group in plan view;
a first electronic component sealed with the sealing body, and mounted on the first component mounting portion;
a substrate sealed with the sealing body, mounted on the first component mounting portion, and arranged adjacent to the first electronic component in plan view; and
a plurality of second electronic components sealed with the sealing body, and respectively mounted on the plurality of second component mounting portions,
wherein each of the first component mounting portion and the plurality of second component mounting portions compose a lead frame,
wherein the plurality of second electronic components are arranged along the second side of the sealing body,
wherein each of the plurality of second electronic components has a surface which an electrode is formed on,
wherein the surface of each of the plurality of second electronic components faces to one of the plurality of second component mounting portions and electrically connects to the one of the plurality of second component mounting portions via a conductive adhesive member,
wherein the first electronic component and a part of the first lead group are electrically connected with each other,
wherein the first electronic component and each of the plurality of second electronic components are electrically connected with each other,
wherein each of the plurality of the second electronic components and a part of the second lead group are electrically connected with each other, and
wherein the first electronic component and a part of the plurality of second electronic components are electrically connected with each other via a first wire coupling the first electronic component and the substrate, the substrate, and a second wire coupling the substrate and the part of the plurality of second electronic components.

2. The semiconductor device according to claim 1,
wherein a wiring is formed on the substrate,
wherein the first wire couples the first electronic component and the wiring of the substrate, and
wherein the second wire couples the part of the plurality of second electronic components and the wiring of the substrate.

3. The semiconductor device according to claim 1,
wherein a number of the substrates is plural.

4. The semiconductor device according to claim 3,
wherein a wiring is formed on each of the plurality of substrates, and
wherein a pattern of the wiring formed on each of the plurality of substrates is different.

5. The semiconductor device according to claim 3,
wherein a wiring is formed on each of the plurality of substrates, and
wherein a pattern of the wiring formed on each of the plurality of substrates is the same.

6. The semiconductor device according to claim 3,
wherein a number of the substrates is two, and
wherein the first electronic component is arranged between the two substrates in plan view.

7. The semiconductor device according to claim 1,
wherein the first component mounting portion and the first electronic component are adhered by a first adhesive member,
wherein the first component mounting portion and the substrate are adhered by a second adhesive member, and
wherein the first adhesive member and the second adhesive member are made of a material of the same type.

8. The semiconductor device according to claim 7,
wherein the conductive adhesive member, the first adhesive member, and the second adhesive member are made of a material of the same type.

9. The semiconductor device according to claim 1,
wherein the first electronic component and a part of first lead(s) of the first lead group are electrically connected with each other via a third wire coupling the first electronic component and the substrate, the substrate and a fourth wire coupling the substrate and the part of the first lead(s).

10. The semiconductor device according to claim 1,
wherein the semiconductor device is a composition of an inverter.

11. The semiconductor device according to claim 10,
wherein each of the plurality of second electronic components is a second semiconductor chip on which a power transistor is formed,
wherein the power transistor functions as a switching element of the inverter, and
wherein the first electronic component is a first semiconductor chip on which a control circuit is formed, and
wherein the control circuit controls an on/off operation of the power transistor formed on the second semiconductor chip.

12. The semiconductor device according to claim 11,
wherein the inverter includes a diode which is electrically connected with the power transistor with each other in anti-parallel connection,
wherein the power transistor formed on each of a plurality of the second semiconductor chips is an insulated gate bipolar transistor,
wherein the semiconductor device includes a plurality of third electronic components respectively mounted on the plurality of second component mounting portions, and
wherein each of the plurality of third electronic components is a third semiconductor chip on which the diode is formed.

13. The semiconductor device according to claim 11,
wherein the semiconductor device is a composition of a three-phrase inverter, and
wherein a plurality of the second semiconductor chips are comprised of three high-side semiconductor chips and three low-side semiconductor chips,
wherein the three high-side semiconductor chips have the power transistor functioning as a high-side switching element formed thereon, and
wherein the three low-side semiconductor chips have the power transistor functioning as a low-side switching element formed thereon.

14. The semiconductor device according to claim 13,
wherein the three high-side semiconductor chips are arranged on one of regions,
wherein the regions are separated by a virtual line as a boundary in plan view,
wherein the virtual line extends in a direction intersecting the first side and the second side of the sealing body, and
wherein the three low-side semiconductor chips are arranged on the other of the regions which are separated by the virtual line as the boundary in plan view.

15. The semiconductor device according to claim 14,
wherein a number of the substrates is two,
wherein the two substrates are a high-side substrate and a low-side substrate,
wherein the first semiconductor chip is arranged on the virtual line in plan view,
wherein the high-side substrate is arranged on the one of regions which is separated by the virtual line as the boundary in plan view, and
wherein the low-side substrate is arranged on the other of the regions which are separated by the virtual line as the boundary in plan view.

16. The semiconductor device according to claim 15,
wherein the power transistor is an insulated gate bipolar transistor,
wherein the first semiconductor chip and a part of the three high-side semiconductor chips are electrically connected with each other via a first gate wire, the high-side substrate, a second gate wire, a first emitter wire, the high-side substrate and a second emitter wire,
wherein the first gate wire couples the first semiconductor chip and the high-side substrate,
wherein the second gate wire couples the high-side substrate and a gate electrode pad of the part of the high-side semiconductor chips,
wherein the first emitter wire couples the first semiconductor chip and the high-side substrate,
wherein the second emitter wire couples the high-side substrate and an emitter electrode pad of the part of the high-side semiconductor chips,
wherein the first semiconductor chip and a part of the three low-side semiconductor chips are electrically connected with each other via a third gate wire, the low-side substrate and a fourth gate wire,
wherein the third gate wire couples the first semiconductor chip and the low-side substrate, and
wherein the fourth gate wire couples the low-side substrate and a gate electrode pad of the part of the low-side semiconductor chips.

* * * * *